(12) United States Patent
Hidaka

(10) Patent No.: US 6,791,875 B2
(45) Date of Patent: Sep. 14, 2004

(54) THIN FILM MAGNETIC MEMORY DEVICE REALIZING BOTH HIGH-SPEED DATA READING OPERATION AND STABLE OPERATION

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/189,528

(22) Filed: Jul. 8, 2002

(65) Prior Publication Data

US 2003/0031046 A1 Feb. 13, 2003

(30) Foreign Application Priority Data

Aug. 9, 2001 (JP) ........................................ 2001-241983

(51) Int. Cl.[7] .............................................. G11C 11/14
(52) U.S. Cl. ........................ 365/171; 365/173; 365/209
(58) Field of Search ................................ 365/171, 173, 365/209

(56) References Cited

U.S. PATENT DOCUMENTS

| | | | |
|---|---|---|---|
| 6,205,073 B1 * | 3/2001 | Naji | ............................ 365/173 |
| 6,349,054 B1 | 2/2002 | Hidaka | |
| 6,504,752 B2 * | 1/2003 | Ito | ............................. 365/171 |

OTHER PUBLICATIONS

Scheuerlein, et al, "*A 10ns Read and Write Non–Volatile Memory Array Using a Magnetic Tunnel Junction and FET Switch and in Each Cell*"ISSCC Digest of Technical Papers, TA7.2, Feb. 2000, pp. 94–95, 128–129 and 409–410.

Durlam, et al "*Non–Volatile RAM Based on Magnetic Tunnel Junction Elements*", ISSCC Digest of Technical Papers, TA7.3, Feb. 2000, pp. 96–97, 130–131 and 410–411.

Naji, et al, "*A 256kb 3.0V 1T1MTJ Nonvolatile Magnetoresistive RAM,*" ISSCC Digest of Technical Papers, TA7.6, Feb. 2001, pp. 94–95, 122–123,404–405 and 438.

\* cited by examiner

Primary Examiner—Huan Hoang
(74) Attorney, Agent, or Firm—McDermott Will & Emery LLP

(57) ABSTRACT

Two complementary bit lines corresponding to a selected column are pulled down to a ground voltage via each of a selected MTJ memory cell and a dummy memory cell and are pulled up to a power supply voltage via a read drive selection gate. A read gate corresponding to the selected column drives the voltages of two complementary read data buses by driving force according to the voltage of corresponding complementary two bit lines, respectively. A data reading circuit executes data reading operation on the basis of a voltage difference between the complementary two read data buses. The power supply voltage is determined in consideration of reliability of a tunneling insulating film of an MTJ memory cell.

31 Claims, 15 Drawing Sheets

THIN FILM MAGNETIC MEMORY DEVICE REALIZING BOTH HIGH-SPEED DATA READING OPERATION AND STABLE OPERATION

BACKGROUND OF THE INVENTION

1. Field of the Invention

The present invention relates to a thin film magnetic memory device and, more particularly, to a random access memory including a memory cell having a magnetic tunnel junction (MTJ).

2. Description of the Background Art

As a memory device capable of storing data in a nonvolatile manner with lower power consumption, attention is paid to an MRAM (Magnetic Random Access Memory) device. The MRAM device is a memory device for storing data in a nonvolatile manner by using a plurality of thin film magnetic elements formed in a semiconductor integrated circuit and each of the thin film magnetic elements can be accessed at random.

Particularly, in recent years, a technique of using a thin film magnetic element using a magnetic tunnel junction (MTJ) as a memory cell to realize dramatically advanced performance of an MRAM device has been announced. An MRAM device including a memory cell having a magnetic tunnel junction is disclosed in technical literature such as "A 10 ns Read and Write Non-Volatile Memory Array Using a Magnetic Tunnel Junction and FET Switch in each Cell", ISSCC Digest of Technical Papers, TA7.2, February 2000 and "Nonvolatile RAM based on Magnetic Tunnel Junction Elements", ISSCC Digest of Technical Papers, TA7.3, February 2000.

FIG. 14 is a schematic diagram showing the configuration of a memory cell having the magnetic tunnel junction (hereinbelow, also simply called "MTJ memory cell").

Referring to FIG. 14, an MTJ memory cell includes a tunneling magneto-resistance element TMR whose electric resistance changes according to the level of stored date and an access transistor ATR for generating a path of a sense current Is passing through tunneling magneto-resistance element TMR in a data reading operation. Access transistor ATR takes the form of, for example, a field effect transistor and is coupled between tunneling magneto-resistance element TMR and a fixed voltage (ground voltage Vss).

For the MTJ memory cell, a write word line WWL for instructing data writing operation, a read word line RWL for executing data reading operation, and a bit line BL as a data line for transmitting an electric signal corresponding to the data level of stored data in the data reading operation and the data write operation are disposed.

FIG. 15 is a conceptual diagram for explaining operation of reading data from the MTJ memory cell.

Referring to FIG. 15, tunneling magneto-resistance element TMR has a ferromagnetic layer FL having a predetermined magnetization direction (hereinbelow, also simply called a "fixed magnetic layer") and a ferromagnetic layer VL magnetized in a direction according to a magnetic field applied from the outside (hereinbelow, also simply called a "free magnetic layer"). Between fixed magnetic layer FL and free magnetic layer VL, a tunneling barrier TB formed by an insulating film is provided. Free magnetic layer VL is magnetized in the same direction as fixed magnetic layer FL or in the direction different from fixed magnetic layer FL in accordance with the data level of stored data.

In the data reading operation, when read word line RWL is activated, access transistor ATR is turned on. It makes it possible to pass sense current Is to a current path of bit line BL, tunneling magneto-resistance element TMR, access transistor ATR, and ground voltage Vss.

The electric resistance of tunneling magneto-resistance element TMR changes according to the relation between the magnetization direction of fixed magnetic layer FL and that of free magnetic layer VL. Concretely, when the magnetization direction of fixed magnetic layer FL and that written in free magnetic layer VL are parallel to each other (the same), the electric resistance of tunneling magneto-resistance element TMR is lower than that in the case where the magnetization directions of the layers are opposite (anti-parallel) to each other. In the specification, the electric resistances of tunneling magneto-resistance element TMR corresponding to stored data "1" and "0" will be described as R1 and R0, respectively. R1 is higher than R0 (R1>R0).

As described above, the electric resistance of tunneling magneto-resistance element TMR changes according to the magnetization directions. By associating the two ways of the magnetization direction of free magnetic layer VL in tunneling magneto-resistance element TMR with levels ("1" and "0") of storage data, respectively, data storing operation can be executed.

A voltage change which is caused in tunneling magneto-resistance element TMR by sense current Is varies according to the magnetization direction of free magnetic layer VL, that is, the level of stored data. For example, when bit line BL is precharged to a predetermined voltage and, after that, sense current Is is passed to tunneling magneto-resistance element TMR, by detecting a change in voltage level of bit line BL, the data stored in the MTJ memory cell can be read.

FIG. 16 is a conceptual diagram for explaining operation of writing data to the MTJ memory cell.

Referring to FIG. 16, in the data write operation, read word line RWL is made inactive and access transistor ATR is turned off. In this case, a data write current for magnetizing free magnetic layer VL in a direction according to write data is passed to each of write word line WWL and bit line BL. The magnetization direction of free magnetic layer VL is determined by a combination of the directions of the data write currents flowing through write word line WWL and bit line BL.

FIG. 17 is a conceptual diagram for explaining the relation between the direction of the data write current and the magnetization direction in the data write operation.

Referring to FIG. 17, the lateral axis Hx denotes the direction of a data write magnetic field H (BL) generated by the data write current flowing in bit line BL. On the other hand, the vertical axis Hy denotes the direction of a data write magnetic field H (WWL) generated by the data write current flowing in write word line WWL.

The magnetization direction of free magnetic layer VL can be newly rewritten only in the case where the sum of data write magnetic fields H(BL) and H(WWL) reaches the area on the outside of the asteroid characteristic line shown in the diagram.

Specifically, when the data write magnetic field applied has the strength corresponding to the area on the inside of the asteroid, the magnetization direction of free magnetic layer VL does not switch. Therefore, in order to update the data stored in the MTJ memory cell, a current at a predetermined level or higher has to be passed to both of write word line WWL and bit line BL. The magnetization direction once written in the tunneling magneto-resistance element, that is, data stored in the MTJ memory cell is held in a nonvolatile manner until new data writing operation is executed.

In the data reading operation as well, sense current Is is passed to bit line BL. However, since sense current Is is generally set to be lower than the data write current by about 1 or 2 digits, the possibility that data stored in the MTJ memory cell is erroneously rewritten in the data reading operation due to an influence of sense current Is is low.

In the above-described technical literature, a technique of constructing a random access memory MRAM device by integrating such MTJ memory cells on a semiconductor substrate is disclosed.

FIG. 18 is a conceptual diagram showing MTJ memory cells packed and arranged in a matrix.

By arranging the MTJ memory cells in a matrix on the semiconductor substrate, a high-density MRAM device can be realized. FIG. 18 shows the configuration in which MTJ memory cells are disposed in rows of n in number and columns of m in number (n and m: natural numbers). As already described, bit line BL, write word line WWL, and read word line RWL have to be disposed for each of the MTJ memory cells. Therefore, for (n×m) MTJ memory cells arranged in the matrix, n write word lines WWL1 to WWLn, n read word lines RWL1 to RWLn, and m bit lines BL1 to BLm are arranged.

A data read current in the data read operation, that is, sense current Is is supplied by a data reading circuit 500 disposed adjacent to the memory array. Data reading circuit 500 includes a current supply unit 510 shared by bit lines BL1 to BLm, a data bus DB, and column selection gates CSG1 to CSGm provided in correspondence with the memory cell columns.

Current supply unit 510 supplies sense current Is to data bus DB. Data bus DB is coupled to bit lines BL1 to BLm via column selection gates CSG1 to CSGm.

Column selection lines CSL1 to CSLm are provided corresponding to memory cell columns, respectively, and are selectively activated in accordance with a column selection result. Similarly, one of read word lines RWL1 to RWLn which is selected according to a row selection result is selectively activated. By a combination of the row selection result and the column selection result, a selected memory cell from which data is to be read is designated.

With such a configuration, by current supply unit 510 shared by a whole memory array 10, sense current Is is selectively supplied to a bit line pulled down by the selected memory cell and is passed to tunneling magneto-resistance element TMR in the selected memory cell. As a result, by detecting a voltage change in data bus DB, data stored in the selected memory cell can be read.

However, the tunneling magneto-resistance element in the MTJ memory cell is a resistor having relatively high electric resistance of about 10 KΩ. On the other hand, data bus DB disposed so as to be shared by whole memory array 10 has a relatively large parasitic capacitance. As shown in FIG. 18, therefore, in the configuration that the selected memory cell is connected to data bus DB via bit line BL and data reading operation is performed by detecting a change in the voltage of data bus DB, it is feared that an R-C time constant of the path of sense current Is becomes large and high speed of data reading operation is disturbed.

In order to pass sense current Is to the selected MTJ memory cell, as shown in FIG. 15, a bias voltage has to be applied across the tunneling magneto-resistance element TMR. When the bias voltage is high, however, an excessive electric field acts on tunneling barrier TB, an insulating film destruction is caused, and reliability of the MTJ memory cell may be lost.

On the other hand, in recent years, a memory device is requested to process data of multiple bits in parallel at the same time. Representatively, to process data at high speed and with low power consumption in the field of data processing or the like, in a memory device applied to a system LSI (large-scale integrated circuit) integrated on a semiconductor chip on which a logic such as a processor is also mounted, data transfer of multiple bits to/from the logic has to be executed in parallel.

In the data write operation to the MRAM device, however, the data write magnetic field for rewriting the magnetization direction of the MTJ memory cell has to be generated, so that a relatively high current has to be passed to bit line BL and write word line WWL. When the MRAM device is applied to such a system LSI, if multi-bit data is simply written in parallel, current consumption, particularly, a peak current value becomes excessive. A load on the power system increases and there is even the possibility of an erroneous operation due to an influence of fluctuation in the power supply voltage.

SUMMARY OF THE INVENTION

The invention has been achieved to solve such problems and an object of the invention is to provide a configuration of a thin film magnetic memory device realizing both assurance of reliability of an MTJ memory cell and high-speed data reading operation.

Another object of the invention is to provide a configuration of a thin film magnetic memory device in which multi-bit data is stably transferred in parallel.

A thin film magnetic memory device according to the invention has a plurality of memory cells each for holding storage data. Each of the memory cells includes a magnetic storing portion having an electric resistance varying according to a level of the storage data, and an access gate which is selectively turned on in a data reading operation. The thin film magnetic memory device further includes: a decoding unit for designating a selected memory cell corresponding to a target from/to which data is read/written from the plurality of memory cells in accordance with an address signal; a bit line disposed every predetermined section of the plurality of memory cells and coupled to a first voltage via the magnetic storing portion of the selected memory cell in response to turn-on of the access gate of the selected memory cell in the data read operation; a bit line driving unit for electrically coupling the bit line to a second voltage which is determined so that a voltage applied across the selected memory cell becomes equal to or lower than a predetermined voltage in the data reading operation; a read data bus shared by the plurality of memory cells for transmitting read data from the selected memory cell; a read gate circuit for driving a voltage on the read data bus to a fixed voltage by a driving force according to the voltage on the bit line coupled to the selected memory cell; and a data reading circuit for generating the read data by sensing and amplifying the voltage on the read data line.

Preferably, the magnetic storing portion has a fixed magnetic layer having a fixed magnetization direction, a free magnetic layer magnetized in a direction according to a level of the storage data by a magnetic field generated by a data write current, and a tunneling film for passing a data read current, formed between the fixed magnetic layer and the free magnetic layer. The electric resistance varies according to a relative relation between the magnetization direction of the fixed magnetic layer and the magnetization direction of the free magnetic layer. The predetermined voltage is determined in consideration of reliability of the tunneling film.

In such a thin film magnetic memory device, a path of a data read current passing through a selected memory cell does not include a read data line having a parasitic capacitance and the potential of the read data bus is driven by a read gate circuit (read gate). Consequently, an R-C load on the cell current path can be lessened. Further, a voltage applied across the magnetic storing part (tunneling magneto-resistance element) in the MTJ memory cell is suppressed to a predetermined voltage or less in consideration of the reliability of the tunneling film (tunneling barrier), so that data reading operation can be performed at higher speed while assuring the reliability of the operation of the MTJ memory cell.

A thin film magnetic memory device according to another aspect of the invention has a plurality of memory cells each for holding storage data. Each of the memory cells includes a magnetic storing portion being magnetized in a direction according to a level of the storage data by a magnetic field generated by a data write current and having an electric resistance varying according to the direction of the magnetization, and an access gate which is selectively turned on in a data reading operation. The thin film magnetic memory device further includes: a decoding unit for designating a selected memory cell corresponding to a target from/to which data is read/written from the plurality of memory cells in accordance with an address signal; a bit line disposed every predetermined section of the plurality of memory cells in order to transmit an electric signal according to the level of the storage data and, in the data read operation, coupled to a first voltage via a magnetic storing portion of the selected memory cell in response to turn-on of the access gate of the selected memory cell; a bit line driving unit for electrically coupling the bit line to a second voltage in the data reading operation; a read data bus for transmitting read data from the selected memory cell, which is shared by the plurality of memory cells; a read gate circuit for driving a voltage on the read data bus to a fixed voltage by a driving force according to the voltage on the bit line coupled to the selected memory cell; a data reading circuit for generating the read data by sensing and amplifying the voltage on the read data line; and a data writing circuit which operates a third voltage supplied which is higher than the second voltage, in a data write operation, for supplying the data write current to the bit line corresponding to the selected memory cell.

In such a thin film magnetic memory device, a path of a data read current passing through a selected memory cell does not include a read data bus having a parasitic capacitance and the potential of the read data bus is driven by a read gate circuit (read gate). Consequently, an R-C load on the cell current path can be lessened. Further, while a voltage applied across the magnetic storing portion (tunneling magneto-resistance element) in the MTJ memory cell is suppressed to a predetermined voltage or less in consideration of the reliability of the tunneling film (tunneling barrier), the power supply voltage of the data write circuit is set to be high in order to supply a sufficient data write current. Therefore, data writing/reading operations can be performed at higher speed while assuring the reliability of the operation of the MTJ memory cell.

A thin film magnetic memory device according to further another aspect of the invention has a plurality of memory cells disposed in a matrix. Each of the memory cells includes a magnetic storing portion being magnetized in a direction according to a level of storage data by a magnetic field generated by a data write current and having an electric resistance changes according to the direction of the magnetization, and an access gate which is selectively turned on in a data read operation to pass a data read current to the magnetic storing portion. The thin film magnetic memory device further includes: a plurality of bit lines each disposed corresponding to a memory cell column, for transmitting an electric signal according to the level of the storage data; a plurality of read data lines each for transmitting read data from a selected memory cell; a plurality of write data lines each for transmitting write data to a selected memory cell; and a control circuit for instructing parallel data reading of M (M: integer of at least 2) bits by using at least a part of the plurality of read data lines in the data read operation, and for instructing parallel data writing of N (N: natural number smaller than M) bits by using a part of the plurality of write data lines in a data write operation.

Such a thin film magnetic memory device can read data of a plurality of bits in parallel in a data read operation and, on the other hand, can set the number of parallel write bits in a data write operation to a value smaller than the number in the data reading operation. Thus, the configuration adapted to a system LSI to be merged on the same chip on which a logic is also mounted can be achieved. By suppressing increase in the peak current consumption in the data write operation, the operation can be stabilized.

Preferably, the M bits is an integral multiple of the N bits, and the control circuit repeatedly instructs the parallel data writing operation of N bits by M/N times in response to a single data write command.

By the operation, the length (the number of bits) of a single data read command and the length (the number of bits) of a single data write command can be adjusted to the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
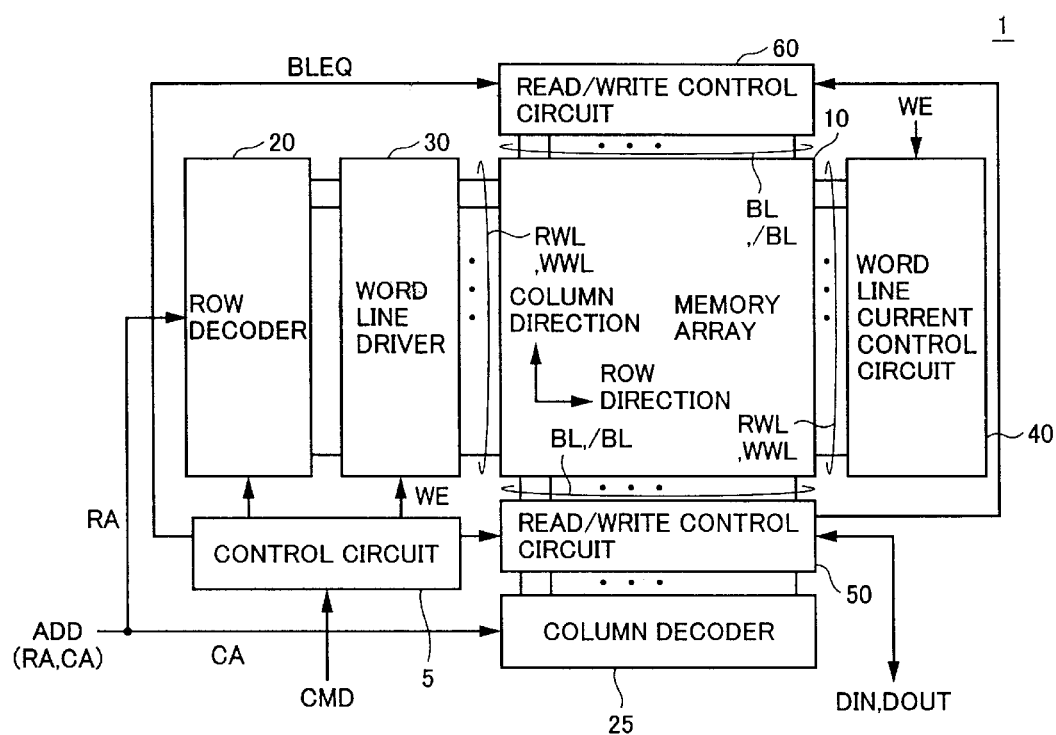
FIG. 1 is a schematic block diagram showing a general configuration of an MRAM device according to an embodiment of the invention.

Embodiments of the invention will be described in detail hereinbelow with reference to the drawings. The same reference numeral in the drawings denotes the same or corresponding components.

First Embodiment

Referring to FIG. 1, an MRAM device 1 according to a first embodiment of the invention executes a random access to receive write data DIN or output read data DOUT in response to a control signal CMD and an address signal ADD from the outside.

MRAM device 1 has a control circuit 5 for controlling the overall operation of MRAM device 1 in response to control signal CMD and a memory array 10 having a plurality of MTJ memory cells arranged in a matrix. Although the configuration of memory array 10 will be described in detail herein later, briefly, a plurality of write word lines WWL and read word lines RWL are arranged corresponding to rows of MTJ memory cells (hereinbelow, also simply called "memory cell rows"), respectively. Bit lines BL are arranged corresponding to columns of MTJ memory cells (hereinbelow, also simply called "memory cell columns"), respectively.

MRAM device 1 further includes a row decoder 20, a column decoder 25, a word line driver 30, a word line current control circuit 40, and read/write control circuits 50 and 60.

Row decoder 20 executes row selection in memory array 10 in accordance with a row address RA expressed by address signal ADD. Column decoder 25 executes column selection in memory array 10 in accordance with a column address CA expressed by address signal ADD. Word line driver 30 selectively activates read word line RWL or write word line WWL on the basis of the result of row selection of row decoder 20. By row address RA and column address CA, a memory cell designated to be a target from which data is read or to which data is written is specified (hereinbelow, also called "selected memory cell").

Word line current control circuit 40 is provided to pass a data write current to write word line WWL in the data writing operation. Read/write control circuits 50 and 60 are a generic name for a circuit group disposed in an area adjacent to memory array 10 to pass the data write current and the sense current (data read current) to bit line BL in the data reading/writing modes.

Figure 2:
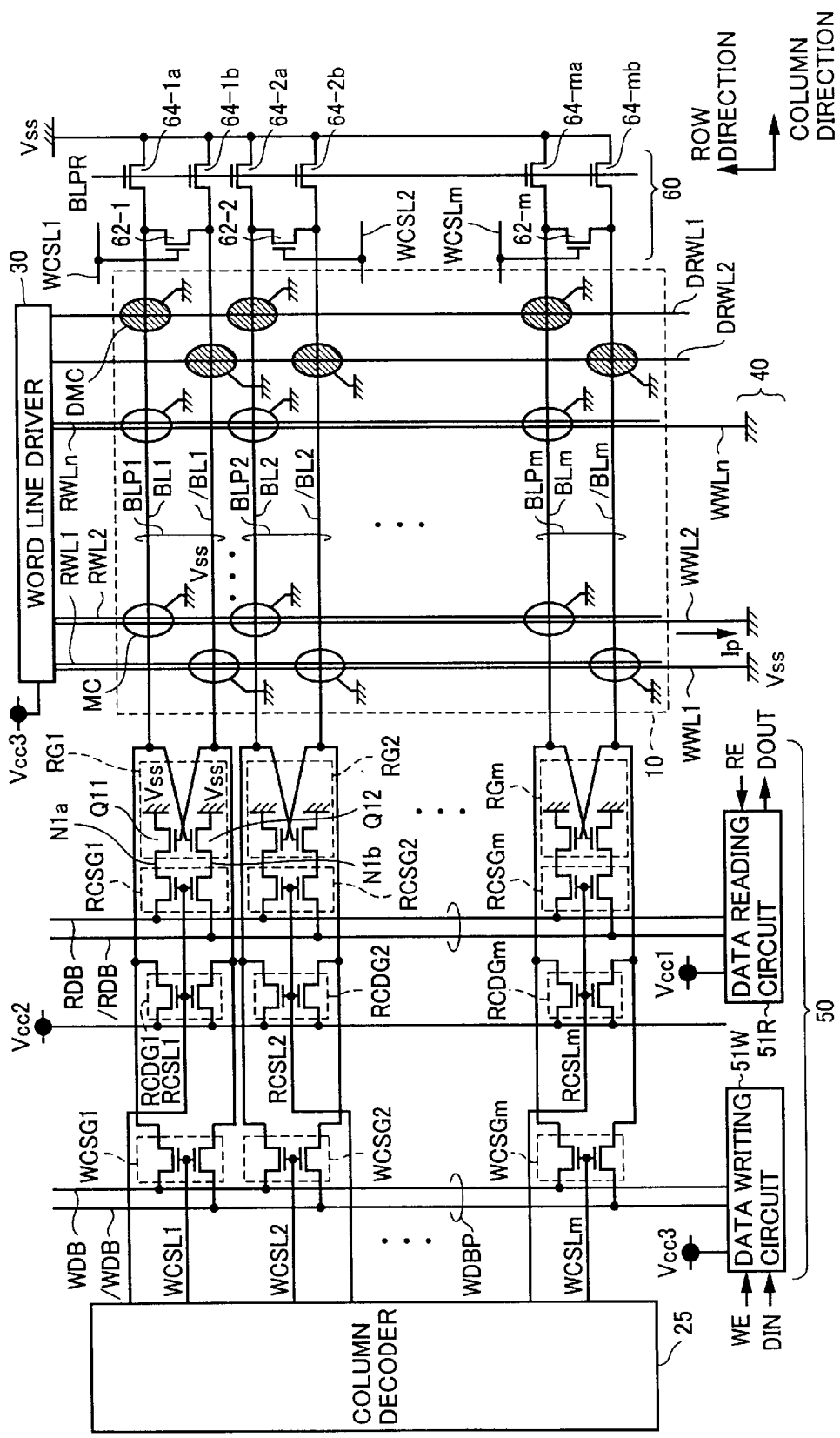
FIG. 2 is a circuit diagram for specifically explaining the configuration according to a first embodiment of a memory array and peripheral circuits of the memory array.

Referring to FIG. 2, memory array 10 has MTJ memory cells MC arranged in n rows and m columns (n, m: natural numbers). The configuration of each of the MTJ memory cells is similar to that shown in FIG. 14 and has tunneling magneto-resistance element TMR acting as a magnetic storage portion whose electric resistance changes according to the level of storage data and access transistor ATR acting as an access gate.

In correspondence with the first to n-th memory cell rows, read word lines RWL1 to RWLn and write word lines WWL1 to WWLn are provided. In correspondence with the first to m-th memory cell columns, bit lines BL1 and /BL1 to BLm and /BLm constructing bit line pairs BLP1 to BLPm are provided, respectively.

In the following, in the case of collectively describing write word lines, read word lines, bit lines, and bit linepairs, they will be described by using reference characters WWL, RWL, BL (/BL), and BLP, respectively. In the case of indicating specific write word line, read word line, bit line, and bit line pair, they will be described as RWL1, WWL1, BL1 (/BL1), and BLP1 by adding numerical subscripts.

MTJ memory cells MC in each row are connected to one of bit lines BL and /BL. For example, with respect to MTJ memory cells belonging to the first memory cell column, the MTJ memory cell in the first row is coupled to bit line /BL1, and the MTJ memory cell in the second row is coupled to bit line BL1. Similarly, the MTJ memory cells in the odd-numbered rows are connected to /BL1 to /BLm each of which is one of bit lines in a bit line pair, and the MTJ memory cells in the even-numbered rows are connected to BL1 to BLm each of which is the other one of bit lines in a bit line pair.

Memory array 10 further has a plurality of dummy memory cells DMC coupled to bit lines BL1 and /BL1 to BLm and /BLm Dummy memory cells DMC are arranged in two rows and m columns so as to correspond to one of dummy read word lines DRWL1 and DRWL2. Dummy memory cells corresponding to dummy read word line DRWL1 are coupled to bit lines BL1, BL2, . . . and BLm. On the other hand, the other dummy memory cells corresponding to dummy read word line DRWL2 are coupled to bit lines /BL1, /BL2, . . . , and /BLm.

Figure 14:
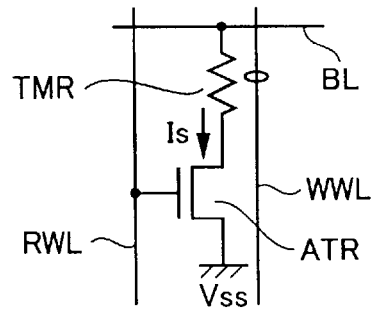
FIG. 14 is a schematic diagram showing the configuration of the MTJ memory cell.
Figure 15:
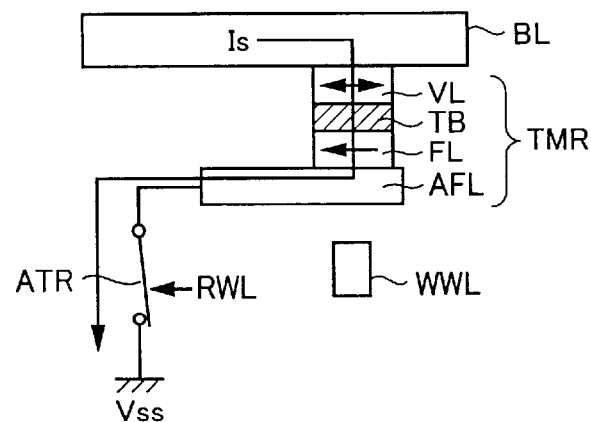
FIG. 15 is a conceptual diagram for explaining operation of reading data from the MTJ memory cell.
Figure 16:
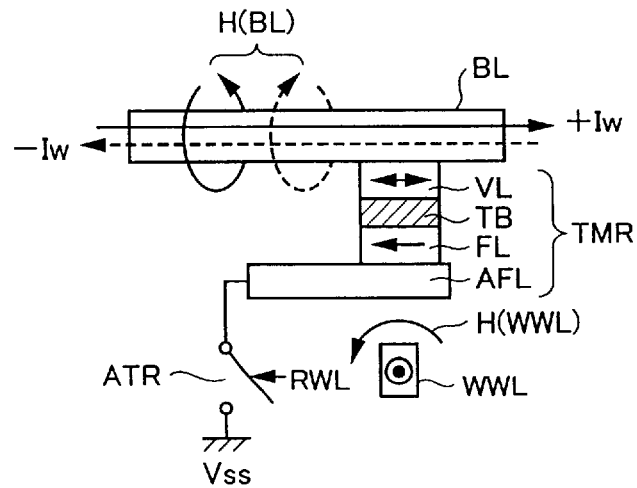
FIG. 16 is a conceptual diagram for explaining operation of writing data to the MTJ memory cell.
Figure 17:
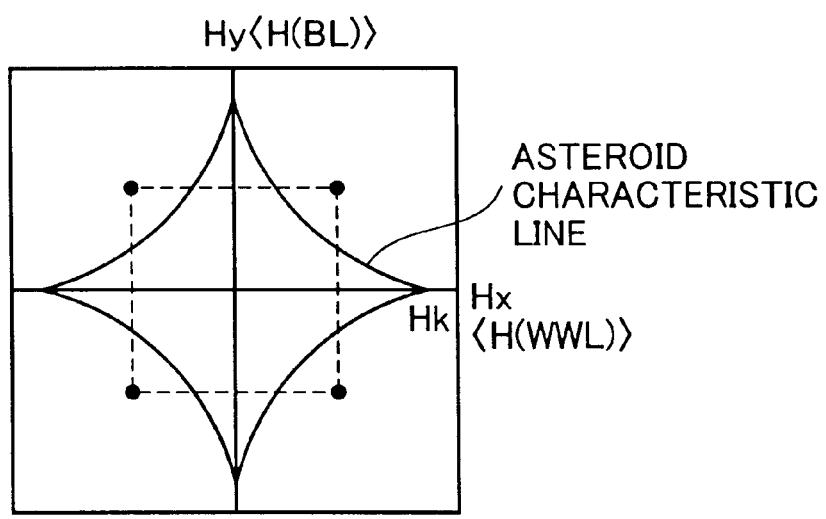
FIG. 17 is a conceptual diagram for explaining the relation between the direction of a data writing current and the direction of magnetization in a data write operation.
Figure 18:
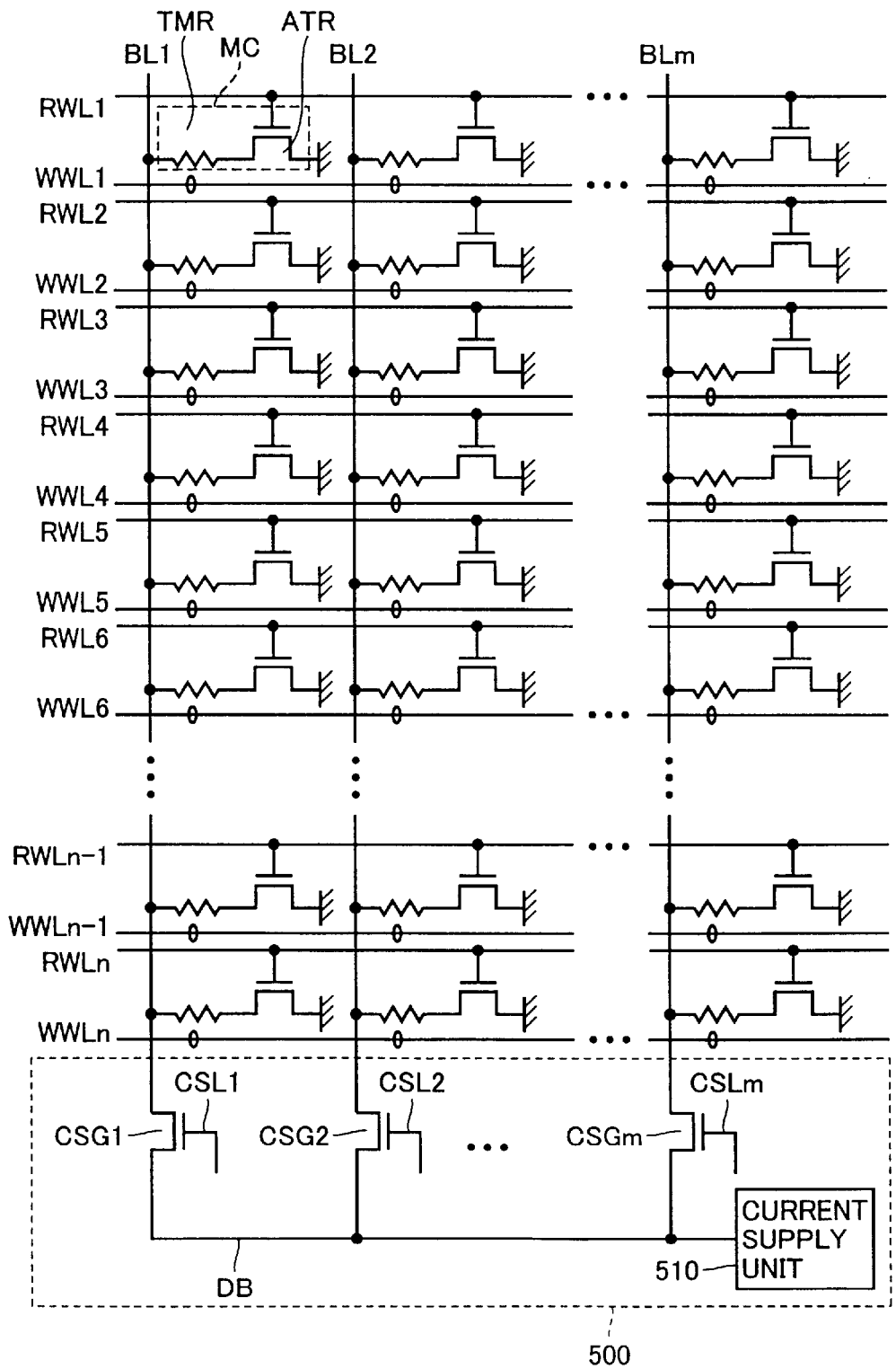
FIG. 18 is a conceptual diagram showing MTJ memory cells packed and arranged in a matrix.

Dummy memory cell DMC has, for example, a configuration obtained by replacing tunneling magneto-resistance element TMR in the configuration of the MTJ memory cell shown in FIG. 14 with a dummy resistive element (not shown). Electric resistance Rd of the dummy resistive element is set to be an intermediate value between electric resistances R1 and R0 corresponding to the levels "1" and "0" of data stored in MTJ memory cell MC, respectively (R1>Rd>R0).

When an odd-numbered row is selected according to the row selection result and bit lines /BL1 to /BLm and MTJ memory cells MC are coupled to each other, dummy read word line DRWL1 is activated and bit lines BL1 to BLm and dummy memory cells DMC are coupled to each other. On the contrary, when an even-numbered row is selected according to a row selection result and bit lines BL1 to BLm and MTJ memory cells MC are coupled to each other, dummy read word line DRWL2 is activated and bit lines /BL1 to /BLm and dummy memory cells DMC are coupled to each other.

In the following, dummy read word lines DRWL1 and DRWL2 will be also generically called a dummy read word line DRWL.

In the following, a high voltage state (power supply voltages Vcc1, Vcc2, and Vcc3) and a low voltage state (ground voltage Vss) of signal and signal lines will be also called the "H" level and "L level", respectively.

In the area on the side opposite to word line driver 30 over memory array 10, word line current control circuit 40 couples each of write word lines WWL to ground voltage Vss. With the configuration, a data write current Ip in a predetermined direction can be passed to a write word line selectively coupled to the power supply voltage by a word line driver.

In correspondence with the first to m-th memory cell columns, write column selection lines WCSL1 to WCSLm and read column selection lines RCSL1 to RCSLm for executing column selection are provided.

In the data write operation, column decoder 25 activates one of write column selection lines WCSL1 to WCSLm to a selection state (H level) in accordance with a result of decoding column address CA, that is, a column selection result. In the data reading operation, column decoder 25 activates one of read column selection lines RCSL1 to RCSLm to the selection state (H level) in accordance with a column selection result.

Further, a write data bus pair WDBP for transmitting write data and a read data bus pair RDBP for transmitting read data are disposed independently of each other. Write data bus pair WDBP is formed of write data buses WDB and /WDB complementary to each other, and read data bus pair RDBP is formed of read data buses RDB and /RDB complementary to each other.

Read/write control circuit 50 includes a data writing circuit 51W, a data reading circuit 51R, and read column selection gates RCSG1 to RCSGm, read gates RG1 to RGm, read drive selection gates RCDG1 to RCDGm, and write column selection gates WCSG1 to WCSGm which are provided in correspondence with memory cell columns.

Since read column selection gates RCSG1 to RCSGm have similar configurations, read gates RG1 to RGm have similar configurations, read drive selection gates RCDG1 to RCDGm have similar configurations, and write column selection gates WCSG1 to WCSGm have similar configurations, which are disposed in correspondence with memory cell columns, the configuration of read column selection gate RCSG1, read gate RG1, read drive selection gate RCDG1, and write column selection gate WCSG1 provided in correspondence with bit lines BL1 and /BL1 will be representatively described.

Read drive selection gate RCDG1 includes transistor switches electrically coupled between bit lines BL1 and /BL1 and power supply voltage Vcc2. The transistor switches are turned on/off in accordance with the voltage on read column selection line RCSL1. To be specific, when read column selection line RCSL1 is activated to the selection state (H level), read drive selection gate RCDG1 electrically couples bit lines BL1 and /BL1 to power supply voltage Vcc2.

Read column selection gate RCSG1 and read gate RG1 are connected in series between read data buses RDB and /RDB and ground voltage Vss. Read column selection gate RCSG1 has a transistor switch electrically coupled between read data bus RDB and a node N1a, and a transistor switch electrically coupled between read data bus /RDB and a node N1b. The transistor switches are turned on/off in accordance with the voltage on read column selection line RCSL1. Specifically, when read column selection line RCSL1 is activated to the selection state (H level), read column selection gate RCSG1 electrically couples read data buses RDB and /RDB and nodes N1a and N1b, respectively.

Read gate RG1 has an N-type MOS transistor Q11 electrically coupled between node N1a and ground voltage Vss and an N-type MOS transistor Q12 electrically coupled between node N1b and ground voltage Vss. The gates of transistors Q11 and Q12 are coupled to bit lines /BL1 and BL1, respectively. Therefore, voltages at nodes N1a and N1b are driven to ground voltage Vss by driving forces according to the voltages of bit lines /BL1 and BL1, respectively.

Concretely, when the voltage on bit line BL1 is higher than that of bit line /BL1, node N1b is driven to ground voltage Vss more strongly by transistor Q12, so that the voltage at node N1a becomes higher than that at node N1b. On the contrary, when the voltage on bit line BL1 is lower than that on bit line /BL1, the voltage at node N1b becomes higher than that at node N1a.

Write column selection gate WCSG1 has a transistor switch electrically coupled between write data bus WDB and bit line BL1 and a transistor switch electrically coupled between write data bus /WDB and bit line /BL1. The transistor switches are turned on/off in accordance with the voltage of write column selection line WCSL1. Specifically, when write column selection line WCSL1 is activated to the selection state (H level), write column selection gate WCSG1 electrically couples write data buses WDB and /WDB and bit lines BL1 and /BL1, respectively.

In the following, read column selection lines RCSL1 to RCSLm, write column selection lines WCSL1 to WCSLm, read column selection gates RCSG1 to RCSGm, read gates RG1 to RGm, read drive selection gates RCDG1 to RCDGm, and write column selection gates WCSG1 to WCSGm will be also simply generically called read column selection line RCSL, write column selection line WCSL, read column selection gate RCSG, read gate RG, read drive selection gate RCDG, and write column selection gate WCSG, respectively.

Read/write control circuit 60 has short-circuiting switch transistors 62-1 to 62-m provided in correspondence with memory cell columns. Short-circuiting switch transistors 62-1 to 62-m are turned on/off in response to write column selection lines WCSL1 to WCSLm, respectively. For example, short-circuiting switch transistor 62-1 is provided in correspondence with the first memory cell column and, in response to activation (H level) of write column selection line WCSL1, electrically couples one end of bit line BL1 and one end of bit line /BL1 (on the side opposite to write column selection gate WCSG1).

Similarly, each of short-circuiting switch transistors 62-2 to 62-m provided in correspondence with the other memory cell columns, in response to activation of corresponding one of write column selection lines WCSL2 to WCSLm, electrically couples corresponding bit lines BL and /BL constructing bit line pair BLP in the corresponding memory cell column.

Read/write control circuit 60 further include precharge transistors 64-1a and 64-1b to 64-ma and 64-mb provided between bit lines BL1 and /BL1 to BLm and /BLm and ground voltage Vss. Each of precharge transistors 64-1a and 64-1b to 64-ma and 64-mb is turned on in response to activation of bit line precharge signal BLPR, thereby precharging bit lines BL1 and /BL1 to BLm and /BLm to ground voltage Vss.

In the following, short-circuiting switch transistors 62-1 to 62-m and precharge transistors 64-1a and 64-1b to 64-ma and 64-mb will be also generically called a short circuiting switch transistor 62 and a precharge transistor 64, respectively.

Bit line precharge signal BLPR generated by control circuit 5 is activated to the H level for, at least, a predetermined period before execution of the data reading operation in an active period of MRAM device 1. On the other hand, in the data reading operation and data writing operation in the active period of MRAM device 1, bit line precharge signal BLPR is made inactive to the L level and precharge transistor 64 is turned off.

The configuration of a data reading circuit and a data writing circuit will now be described.

Figure 3:
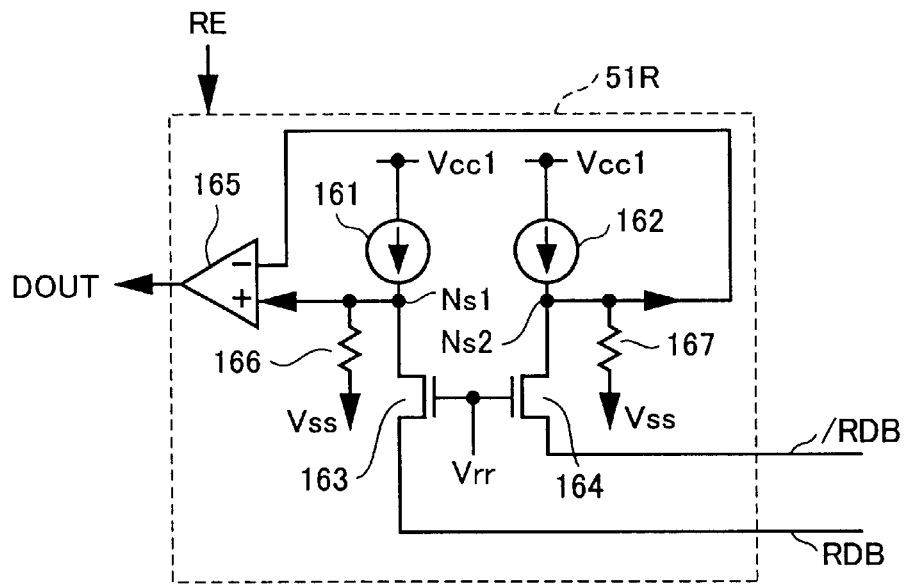
FIG. 3 is a circuit diagram showing the configuration of a data reading circuit illustrated in FIG. 2.

Referring to FIG. 3, data reading circuit 51R has: current sources 161 and 162 for receiving power supply voltage Vcc1 and supplying a predetermined current to each of internal nodes Ns1 and Ns2; an N-type MOS transistor 163 electrically coupled between internal node Ns1 and read data bus RDB; an N-type MOS transistor 164 electrically coupled between internal node Ns2 and read data bus /RDB; and an amplifier 165 for amplifying a voltage level difference between internal nodes Ns1 and Ns2 and outputting read data DOUT.

A reference voltage Vrr is applied to the gate of each of N-type MOS transistors 163 and 164. Resistors 166 and 167 are provided to pull down internal nodes Ns1 and Ns2 to ground voltage Vss. With such a configuration, data reading circuit 51R can supply the sense current to read data buses RDB and /RDB in the data reading operation.

In the data reading operation, by read gate RG corresponding to a selected memory cell column, read data buses RDB and /RDB are pulled down to ground voltage Vss by different driving forces. By amplifying the voltage difference between internal nodes Ns1 and Ns2 by data reading circuit 51R, the data stored in the selected memory cell can be read.

Figure 4:
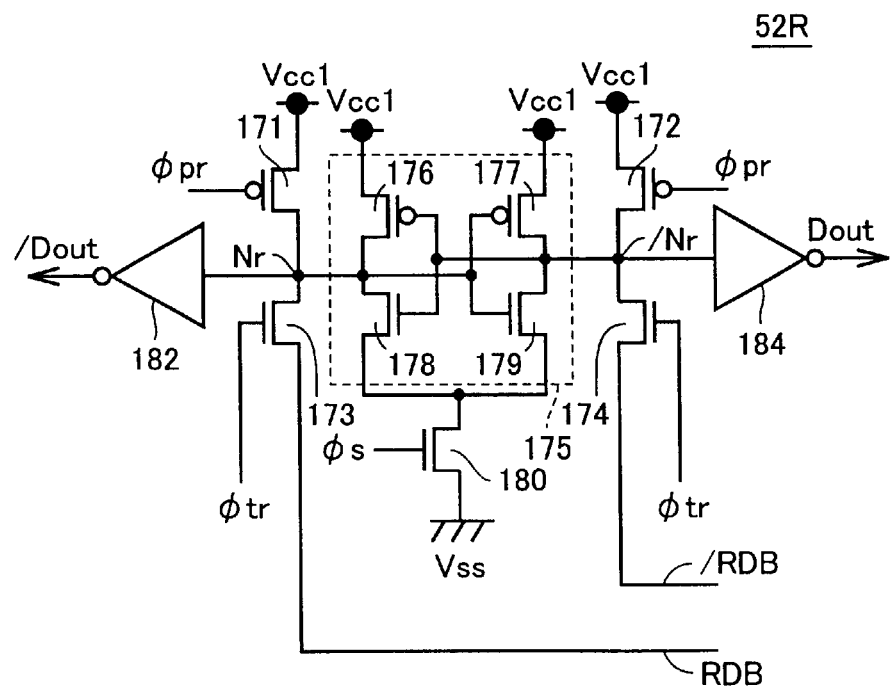
FIG. 4 is a circuit diagram showing another configuration of the data reading circuit illustrated in FIG. 2.

Referring to FIG. 4, a data reading circuit 52R which corresponds to a variation of data reading circuit 51R has: P-type MOS transistors 171 and 172 used as precharge transistors; N-type MOS transistors 173 and 174 used as switching transistors; a cross-coupled amplifier 175; an N-type MOS transistor 180 used as a switch for supplying an operation current to the cross-coupled amplifier; and inverters 182 and 184.

P-type MOS transistor 171 is electrically coupled between power supply voltage Vcc1 and internal node Nr, and P-type MOS transistor 172 is electrically coupled between power supply voltage Vcc1 and internal node /Nr. To each of the gates of P-type MOS transistors 171 and 172, a precharge signal φpr which is activated to the L level for a predetermined period before the data reading operation is supplied.

N-type MOS transistor 173 is electrically coupled between internal node Nr and read data bus RDB, and N-type MOS transistor 174 is electrically coupled between internal node /Nr and read data bus /RDB. To each of the gates of MOS transistors 173 and 174, a trigger pulse φtr which is activated to the L level for a predetermined period in the data reading operation is supplied.

Cross-coupled amplifier 175 has P-type MOS transistors 176 and 177 and N-type MOS transistors 178 and 179 which are cross coupled. N-type MOS transistor 180 is electrically coupled between cross-coupled amplifier 175 and ground voltage Vss and receives a sense signal φs by its gate. Sense signal φs has an active period (H level) which is overlapped with at least trigger pulse φtr in the data reading operation.

Before the data reading operation, each of nodes Nr and /Nr is precharged to power supply voltage Vcc1 in response to activation of precharge signal φpr. In a state where nodes Nr and /Nr are electrically coupled with read data buses RDB and /RDB, respectively, the data reading operation is started. Further, at a predetermined timing after the data reading operation is started, in response to the activation (L level) of trigger pulse φtr, N-type MOS transistors 173 and 174 electrically disconnect read data buses RDB and /RDB from internal nodes Nr and /Nr, respectively.

Cross-coupled amplifier 175 receives the operating current supplied from N-type MOS transistor 180 in response to activation of sense signal φs and amplifies the voltage difference between internal nodes Nr and /Nr to the amplitude between power supply voltage Vcc1 and ground voltage Vss. That is, in the case where the voltage on read data bus RDB becomes higher than that on read data bus /RDB by the data reading operation, internal nodes Nr and /Nr are set to power supply voltage Vcc1 and ground voltage Vss, respectively.

Inverters 182 and 184 invert the voltage levels at internal nodes Nr and /Nr to thereby generate read data /DOUT and DOUT, respectively. That is, the polarities of read data DOUT and /DOUT coincide with those of read data buses RDB and /RDB, respectively.

Figure 5:
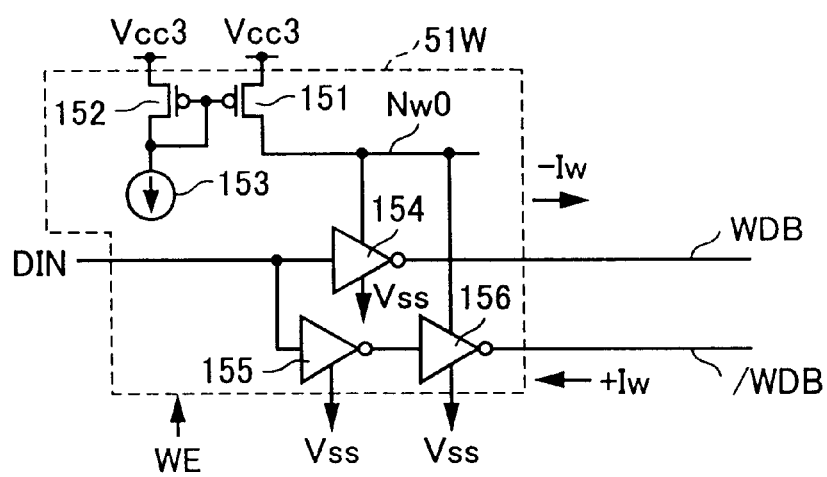
FIG. 5 is a circuit diagram showing the configuration of a data writing circuit illustrated in FIG. 2.

Referring to FIG. 5, data writing circuit 51W has: a P-type MOS transistor 151 for supplying a constant current to an internal node Nw0; a P-type MOS transistor 152 and a current source 153 constructing a current mirror circuit for controlling a current passed through transistor 151; and inverters 154, 155, and 156 operating on an operation current supplied via internal node Nw0. Each of inverters 154, 155, and 156 operates on power supply voltage Vcc3 and ground voltage Vss supplied.

Inverter 154 inverts the voltage level of write data DIN and transmits the resultant to write data bus WDB. Inverter 155 inverts voltage level of write data DIN and transmits the resultant to an input node of inverter 156. Inverter 156 inverts an output of inverter 155 and transmits the resultant to write data bus /WDB. Therefore, data writing circuit 51W sets the voltage at each of inverter nodes Nw1 and Nw2 to one of power supply voltage Vcc3 and ground voltage Vss in accordance with the voltage level of write data DIN.

Figure 6:
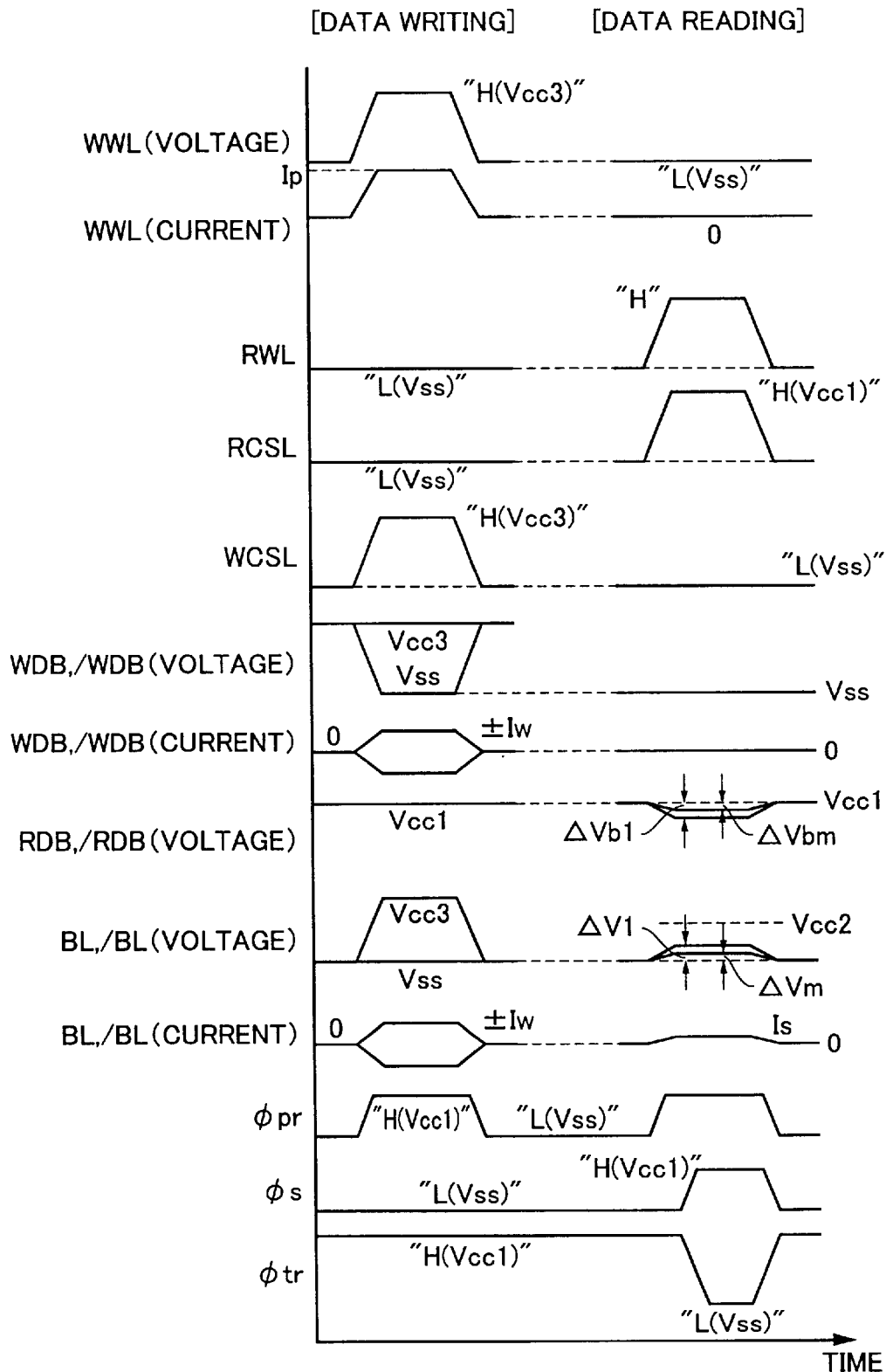
FIG. 6 is a timing chart for explaining data reading operation and data writing operation in the MRAM device according to the first embodiment.

Referring to FIG. 6, the data reading and writing operations in the MRAM device according to the first embodiment will now be described.

First, the data reading operation will be described.

Before the data reading operation, read data buses RDB and /RDB are precharged to power supply voltage Vcc1 and bit lines BL and /BL are precharged to ground voltage Vss.

In the data reading operation, each of bit lines BL and /BL corresponding to a selected memory cell is electrically coupled to power supply voltage Vcc2 by corresponding read drive selection gate RCDG.

Further, one of read word lines RWL which corresponds to the selected memory cell is activated to the selection state (H level) in accordance with a row selection result. As a result, the selected memory cell is electrically coupled between one of bit lines BL and /BL and ground voltage Vss. One of dummy read word lines DRWL1 and DRWL2 is activated, and the other one of bit lines BL and /BL which is not coupled to MTJ memory cell MC is coupled to dummy memory cell DMC.

On the other hand, write word line WWL and write column selection line WCSL are made inactive to the L level (ground voltage Vss). No current is passed to write word line WWL and write data buses WDB and /WDB.

As described above, in the data reading operation, each of bit lines BL and /BL is pulled down to ground voltage Vss via the selected memory cell or dummy memory cell DMC acting as a resistor. Further, in the selected memory cell column, each of corresponding bit lines BL and /BL is pulled up to power supply voltage Vcc2 by read drive selection gate RCDG. The voltages on bit lines BL and /BL are determined according to the balance of pull-up force (to Vcc2) and pull-down force (to Vss), in other words, the electric resistance of the selected memory cell or dummy memory cell as a resistor.

For example, when the level of data stored in the selected memory cell is "1" (electric resistance R1), in one of bit lines BL and /BL connected to the memory cell, a voltage change ΔV1 larger than a voltage change ΔVm which occurs in the other one of bit lines BL and /BL coupled to dummy memory cell DMC occurs. The relation between the voltages of bit lines BL and /BL constructing bit line pair BLP corresponding to the selected memory cell changes according to the level of the storage data which is read. According to such a voltage difference between bit lines BL and /BL, the potentials of read data buses RDB and /RDB are driven by read gate RG.

That is, when the voltage on bit line BL is higher than that on bit line /BL, read data bus /RDB is driven to the ground voltage Vss side more strongly as compared with read data bus RDB by read gate RG (voltage changes in FIG. 6 satisfy the relation of ΔVb1>ΔVbm).

The voltage difference between read data buses RDB and /RDB which occurs as described above is amplified by data reading circuit 51R or 52R, thereby enabling H-level read data DOUT to be output. In the case of using data reading circuit 52R, precharge signal φpr is made inactive to the H level during the data reading operation. Further, after elapse of predetermined time since the data reading operation has started, sense signal φs is activated to the H level, and trigger pulse φtr is activated to the L level so as to have an active period overlapped with sense signal φs.

On the contrary, when the selected memory cell holds "0" (electric resistance R0), that is, when the voltage on bit line /BL is higher than that on bit line BL, by read gate RG, read data bus /RDB is driven to the ground voltage Vss more strongly as compared with read data bus RDB. On the basis of the voltage difference between read data buses RDB and /RDB, L-level read data DOUT can be output.

With the configuration of driving the potentials of read data buses RDB and /RDB via read gate RG, data reading operation can be executed while eliminating read data buses RDB and /RDB having a large parasitic capacitance from the path of the sense current flowing through the selected memory cell (or dummy memory cell) and the bit lines. In such a manner, an R-C load on the path of the sense current passing through the selected memory cell and dummy memory cell can be suppressed, and a voltage change necessary for reading data can be promptly caused in bit lines BL and /BL. Consequently, the data reading operation can be performed at higher speed, and an access to the MRAM device can be made at higher speed.

Further, in order to suppress a voltage applied across tunneling magneto-resistance element TMR in the MTJ memory cell, power supply voltage Vcc2 for pulling up bit lines BL and /BL during the data reading operation is determined. Generally, in consideration of the reliability of the insulating film as a tunneling barrier in the tunneling magneto-resistance element, the bias voltage has to be set to be about 400 [mV] or lower. As a result, the operation reliability of the MTJ memory cell is assured and, moreover, the data reading operation can be performed at higher speed.

Since the precharge voltage of bit lines BL and /BL is set to the ground voltage, in a not-selected column, a discharge current does not occur from bit lines BL and /BL via the access transistor which is turned on in response to the activation of read word line RWL of the selected row. As a result, power consumption by charging/discharging in association with the precharge in bit lines BL and /BL can be reduced.

The data write operation will now be described.

Write column selection line WCSL corresponding to a column selection result is activated to the selection state (H level) and corresponding write column selection gate WCSG is turned on. Accordingly, one end of bit line BL and one end of bit line /BL in the selected column corresponding to the selected memory cell are coupled to write data buses WDB and /WDB, respectively.

Further, in the data write operation, corresponding short-circuiting switch transistor 62 is turned on to short-circuit the other ends of bit lines BL and /BL in the selected column (on the side opposite to write column selection gate WCSG).

As already described above, data writing circuit 51W sets each of write data buses WDB and /WDB to one of power supply voltage Vcc3 and ground voltage Vss. For example, when the data level of write data DIN is the L level, a data write current −Iw for writing L-level data to write data bus WDB is passed. Data write current −Iw is supplied to bit line BL in the selected column via write column selection gate WCSG.

Data write current −Iw passed to bit line BL in the selected column is returned by short-circuiting switch transistor 62. Consequently, to the other bit line /BL, a data write current +Iw in the opposite direction is passed. Data write current +Iw flowing through bit line /BL is transmitted to write data bus /WDB via write column selection gate WCSG.

Further, one of write word lines WWL is activated to the selection state (H level: power supply voltage Vcc3) in accordance with a row selection result, and data write current Ip is passed. As a result, data is written to the selected memory cell in which the data write current is passed to both corresponding write word line WWL and bit line BL (or /BL). The direction of each of data write currents −Iw and +Iw passed through bit lines BL and /BL in the selected column is switched according to the data level of write data DIN.

In the data write operation, read word line RWL is maintained in the non-selection state (L level). In data reading circuit 52R, precharge signal φpr is activated to the H level in the data write operation. On the other hand, sense signal φs is made inactive to the L level, and trigger pulse φtr is made inactive to the H level.

Also in the data write operation, by activating bit line precharge signal BLPR to the H level, the voltages on bit lines BL and /BL in the data write operation are set to ground voltage Vss corresponding to the precharge voltage level in the data read operation.

Similarly, the voltage of each of read data buses RDB and /RDB is set to power supply voltage Vcc1 corresponding to the precharge voltage in the data read operation. By matching the voltage in the data write operation in each of bit lines BL and /BL in the not-selected column and read data buses RDB and /RDB with the precharge voltage prepared for data reading operation, a new precharging operation before the data reading operation becomes unnecessary, so that the data reading operation can be performed at higher speed.

The power supply voltage level of the data read and data write circuit systems will now be described. Vcc1 as operation power supply voltage of data reading circuits 51R and 52R and Vcc2 as the voltage for pulling up bit lines BL and /BL are set so as to satisfy Vcc1>Vcc2 in order to reduce the bit line amplitude to thereby suppress the voltage applied across the tunneling magneto-resistance element and to increase the amplitude voltage of read data buses RDB and /RDB.

On the other hand, in the data write operation, tunneling magneto-resistance element TMR in the selected memory cell has to be sufficiently magnetized. For this purpose, Vcc3 as an operation power supply voltage of data writing circuit 51W is set to be higher than power supply voltages Vcc1 and Vcc2 to supply a sufficient data write current via write data buses WDB and /WDB, that is, the setting is made to satisfy the relations of Vcc3>Vcc1>Vcc2.

For example, by using a configuration such that, as power supply voltage Vcc3, an external power supply voltage supplied from the outside of the MRAM device is used as it is and, further, the external power supply voltage is decreased by a not-illustrated voltage down converting circuit to generate power supply voltages Vcc1 and Vcc2, the power supply voltages according to the relation of "Vcc3>Vcc1>Vcc2" can be efficiently supplied.

Modification of First Embodiment

Figure 7:
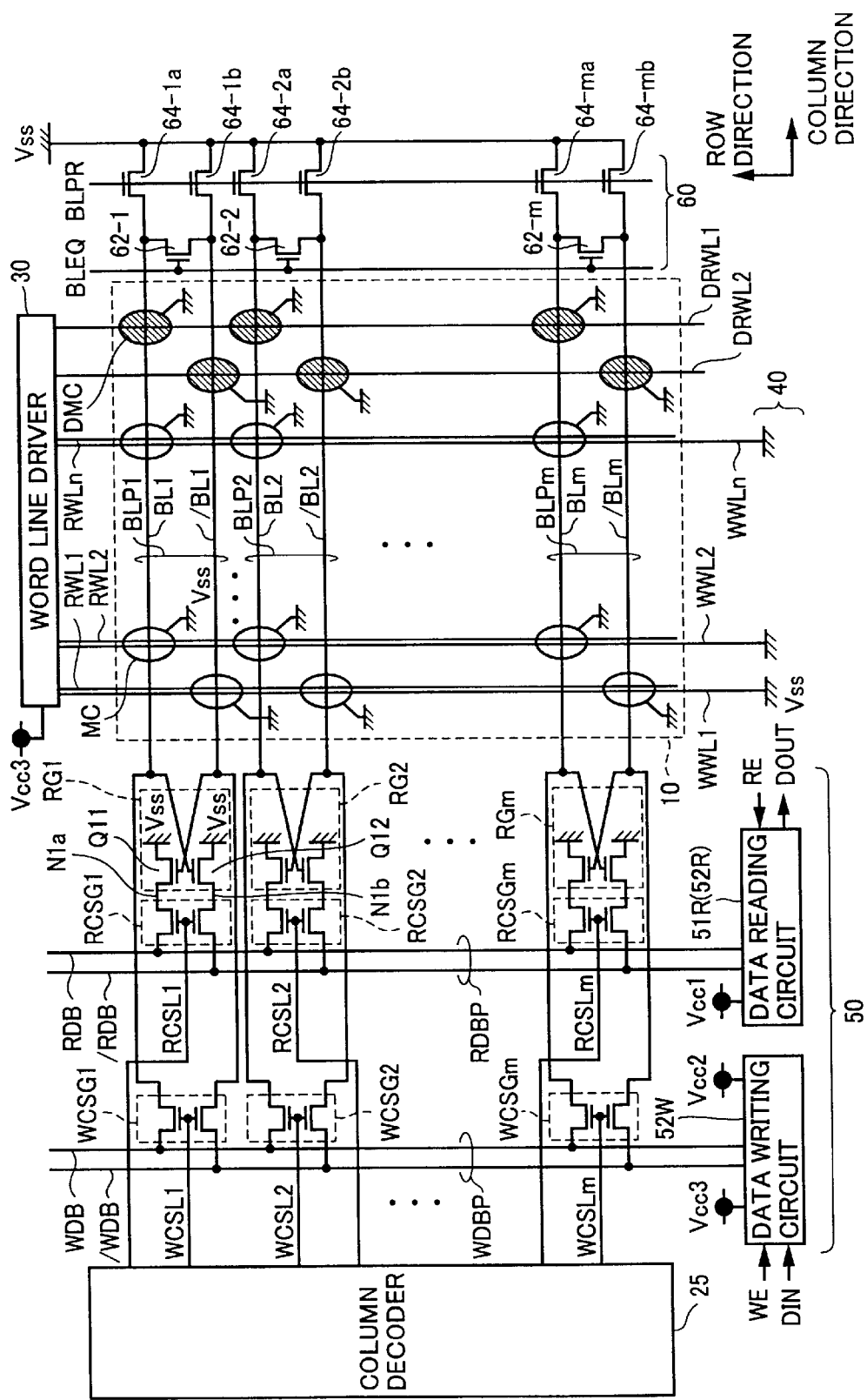
FIG. 7 is a circuit diagram for specifically explaining the configuration of a modification of the first embodiment of the memory array and peripheral circuits of the memory array.

Referring to FIG. 7, the configuration according to a modification of the first embodiment is different from that of the first embodiment with respect to the point that a data writing circuit 52W is provided in place of data writing circuit 51W, and the point that read drive selection gates RCDG1 to RCDGm are not disposed.

Figure 8:
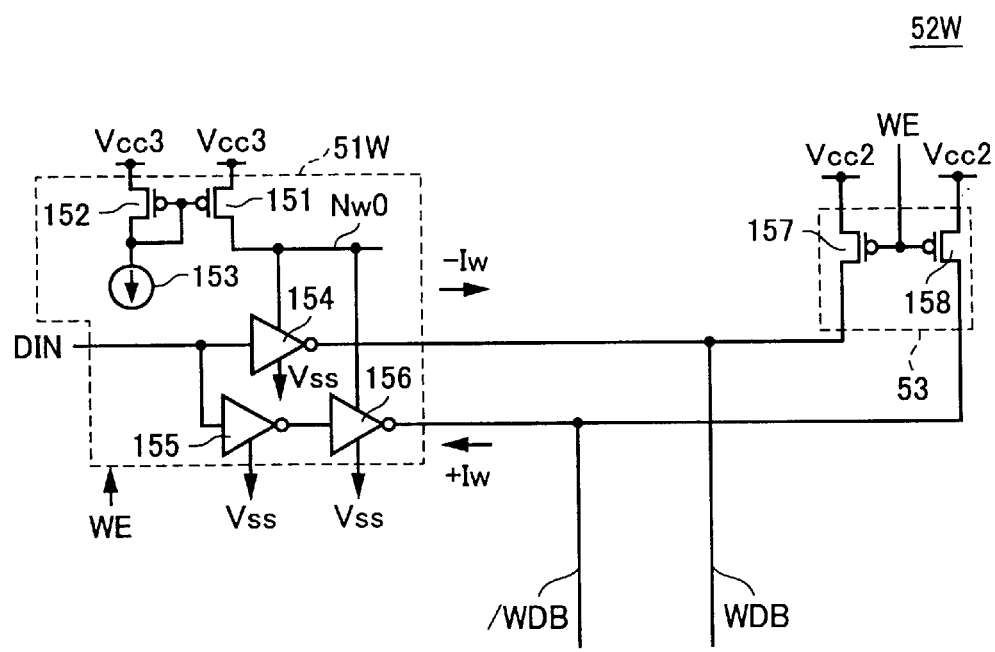
FIG. 8 is a circuit diagram for explaining the configuration of a data writing circuit illustrated in FIG. 7.

Referring to FIG. 8, data writing circuit 52W according to the modification of the first embodiment further includes a pull-up circuit 53 in addition to the configuration of data writing circuit 51W for supplying the data write current.

Pull-up circuit 53 has a pull-up transistor 157 electrically coupled between power supply voltage Vcc2 and write data bus WDB and a pull-up transistor 158 electrically coupled between power supply voltage Vcc2 and write data bus /WDB. Each of pull-up transistors 157 and 158 can take the form of a P-type MOS transistor for receiving by its gate a write control signal WE which is activated to the H level, for example, in the data write operation and is made inactive to the L level in the data read operation. Since the configuration of the portion corresponding to data writing circuit 51W is similar to that shown in FIG. 5, the detailed description will not be repeated.

In the data write operation, pull-up transistors 157 and 158 are turned off. Consequently, in a manner similar to data writing circuit 51W, data write currents ±Iw can be supplied to write data buses WDB and /WDB. On the other hand, in the data read operation, the supply of data write currents ±Iw by the portion corresponding to data writing circuit 51W is stopped and, each of write data buses WDB and /WDB is pulled up to power supply voltage Vcc2 by pull-up transistors 157 and 158 which are turned on.

Figure 9:
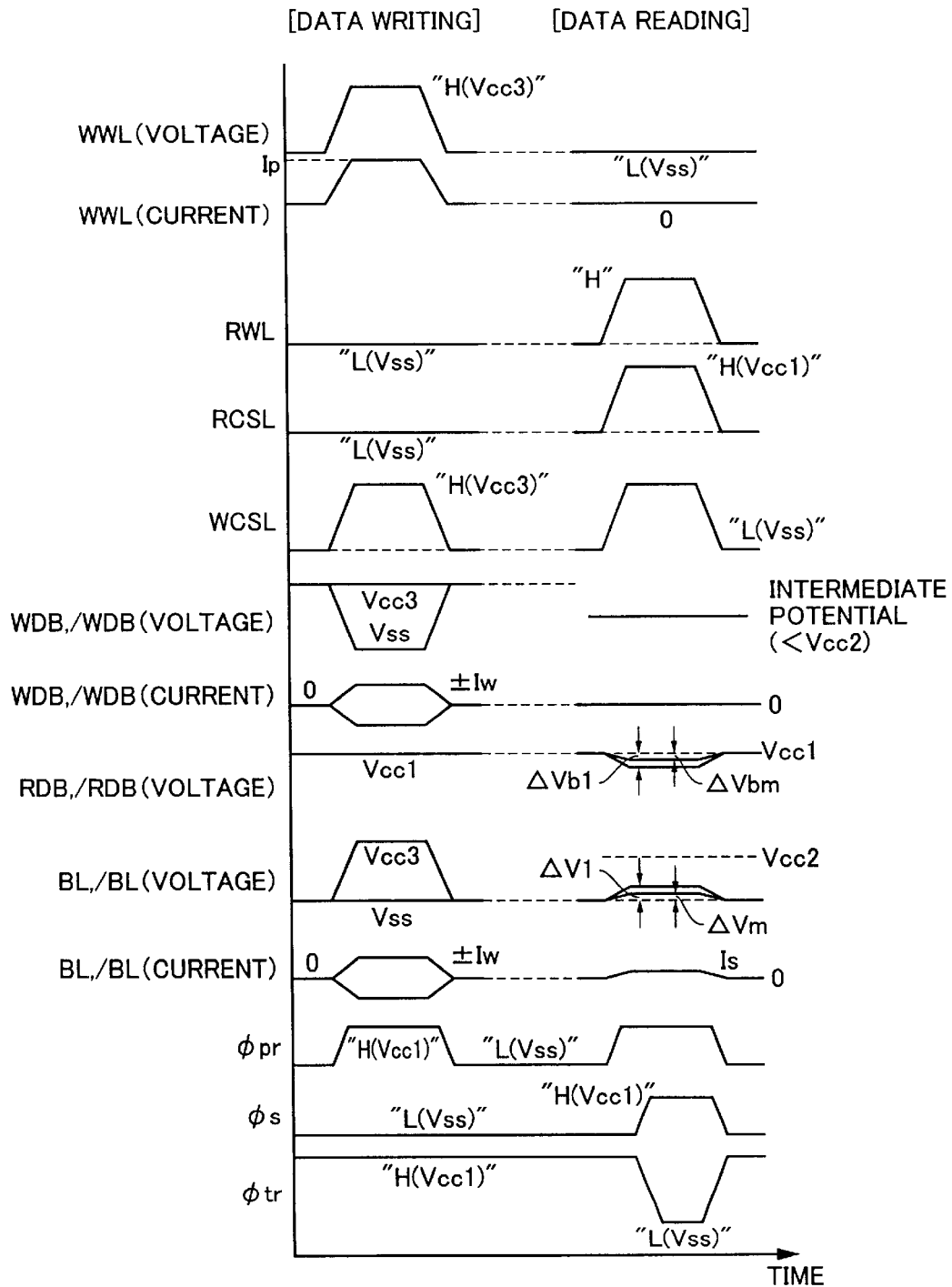
FIG. 9 is a timing chart for explaining data writing operation and data reading operation according to the modification of the first embodiment.

Referring to FIG. 9, in the configuration according to the modification of the first embodiment, also in the data reading operation, write column selection line WCSL corresponding to the selected column is activated to the H level. As a result, write data buses WDB and /WDB pulled up to power supply voltage Vcc2 are electrically coupled to bit lines BL and /BL in the selected column.

That is, the configuration according to the modification of the first embodiment is different from that according to the first embodiment with respect to the point that bit lines BL and /BL in the selected column are pulled up by a data write circuit system (data writing circuit 52W). Since voltage changes which occur in bit lines BL and /BL pulled up to power supply voltage Vcc2 and read data buses RDB and /RDB driven to ground voltage Vss by read gate RG and the data reading operation performed by detecting the voltage changes are similar to those described in FIG. 6, the detailed description will not be repeated.

Since the operation in the data writing operation is also similar to that in FIG. 6, the detailed description will not be repeated.

In the configuration according to the modification of the first embodiment, read drive selection gates RCDG1 to RCDGm may not be provided to efficiently pull up bit lines BL and /BL corresponding to the selected column. Since write data buses WDB and /WDB can be pulled up to power supply voltage Vcc2 at time other than the data writing operation, deterioration in operating speed at the start of the data reading operation is not caused.

The voltage levels of power supply voltages Vcc1, Vcc2, and Vcc3 may be set in a manner similar to the first embodiment.

Second Embodiment

In a second embodiment, the configuration of an MRAM device for receiving/transmitting multi-bit data in parallel from/to the outside will be described.

Figure 10:
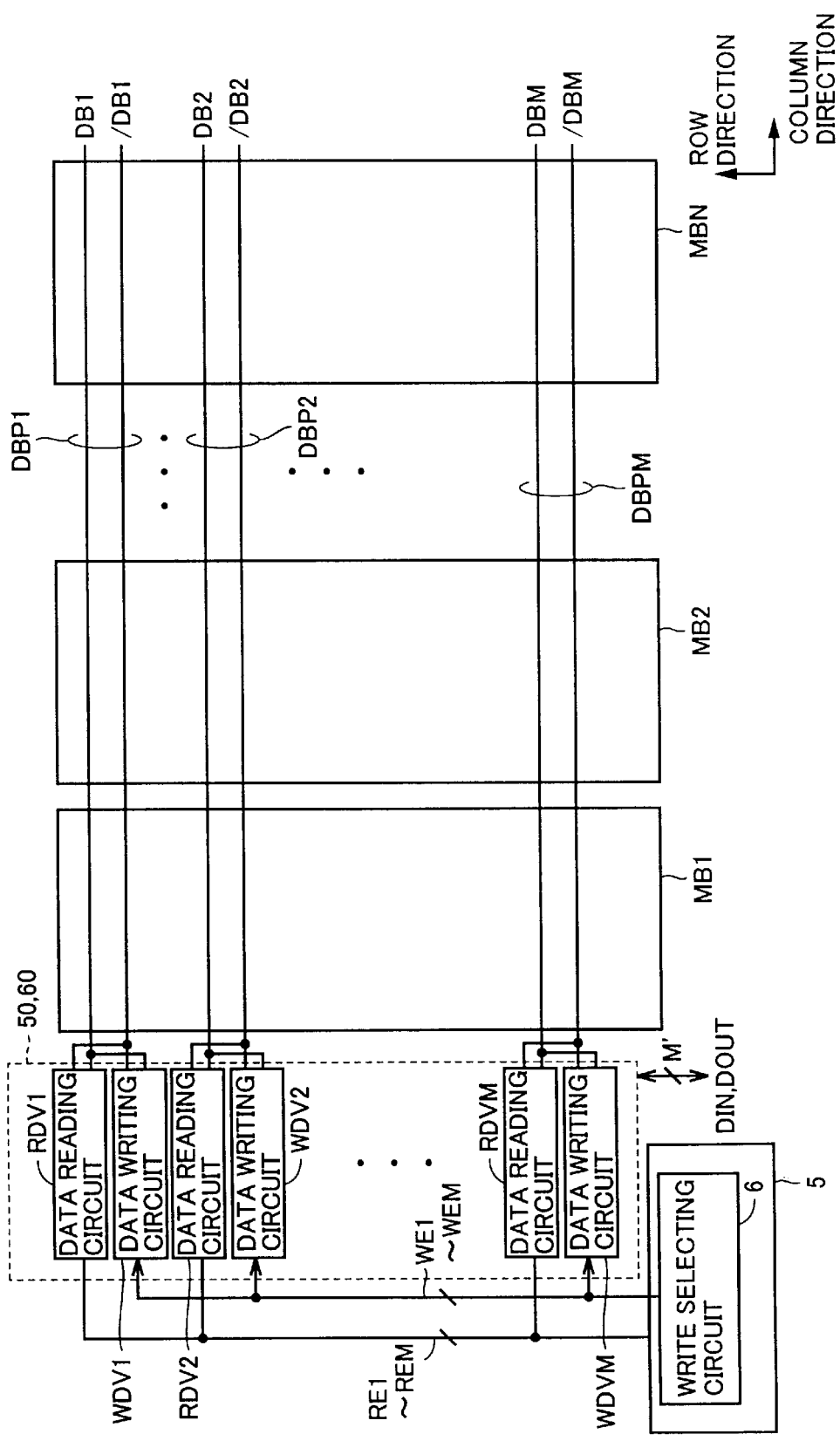
FIG. 10 is a schematic block diagram for explaining the configuration according to a second embodiment of the memory array and peripheral circuits of the memory array.

Referring to FIG. 10, a memory array according to the second embodiment has N (N: integer of 2 or larger) memory banks MB1 to MBN arranged in the column direction. Each of memory banks MB1 to MBN has a configuration similar to that of memory array 10 in the first embodiment.

Along the column direction, M (M: integer of 2 or larger) data bus pairs DBP1 to DBPM shared by memory banks MB1 to MBN are disposed. For example, data bus pair DBP1 has complementary data buses DB1 and /DB1. In the following, data bus pairs DBP1 to DBPM will be also simply generically called a data bus pair DBP, data buses DB1 to DBM will be also simply generically called a data bus DB, and data buses /DB1 to /DBM will be also simply generically called a data bus /DB.

Read/write control circuits 50 and 60 have data reading circuits RDV1 to RDVM and data writing circuits WDV1 to WVDM, respectively, provided in correspondence with data bus pairs DBP1 to DBPM. Data reading circuits RDV1 to RDVM operate in response to read control signals RE1 to REM, respectively. Similarly, data writing circuits WDV1 to WDVM operate in response to write control signals WE1 to WEM, respectively.

To each of data reading circuits RDV1 to RDVM, the configuration of data reading circuits 51R and 52R described by referring to FIGS. 3 and 4 can be applied. Specifically, in data reading circuits 51R and 52R, by detecting and amplifying the voltages of corresponding data buses DB and /DB in place of read data buses RDB and /RDB, similar data reading operation can be executed.

Particularly, by constructing each of memory banks MB1 to MBK so as to execute data reading operation by using a read gate in a manner similar to the first embodiment, data reading circuit 52R which does not have a function of supplying sense current Is and is adapted to miniaturization can be applied. Therefore, the high speed of the data reading operation and the reliability of the operation of the MTJ memory cell can be assured and reduction in the chip area can be achieved in the configuration where a number of data reading circuits are disposed.

In the case of using data reading circuit 51R having the function of supplying sense current Is, by passing sense current Is to a selected memory cell via data bus DB (/DB) and bit line BL (/BL) in a manner similar to the conventional technique, data can be read.

To each of data writing circuits WDV1 to WDVM, the configuration of data writing circuits 51W and 52W shown in FIGS. 5 and 8, respectively, can be applied. Specifically, in data writing circuits 51W and 52W, by employing the configuration of driving the voltage of corresponding data buses DB and /DB in place of write data buses WDB and /WDB, similar data writing operation can be executed.

Particularly, in the case of constructing each of memory banks MB1 to MOK so as to execute the data reading operation by using a read gate similar to that in the first embodiment, by applying data writing circuit 52W, the chip area can be further reduced.

With such a configuration, each data bus pair DBP can independently transmit/receive data to/from the selected memory cell. Therefore, by using a plurality of data bus pairs DBP at the same time, data of a plurality of bits can be read/written in parallel.

Data bus pair DBP is disposed every k memory cells (k: natural number).

Figure 11:
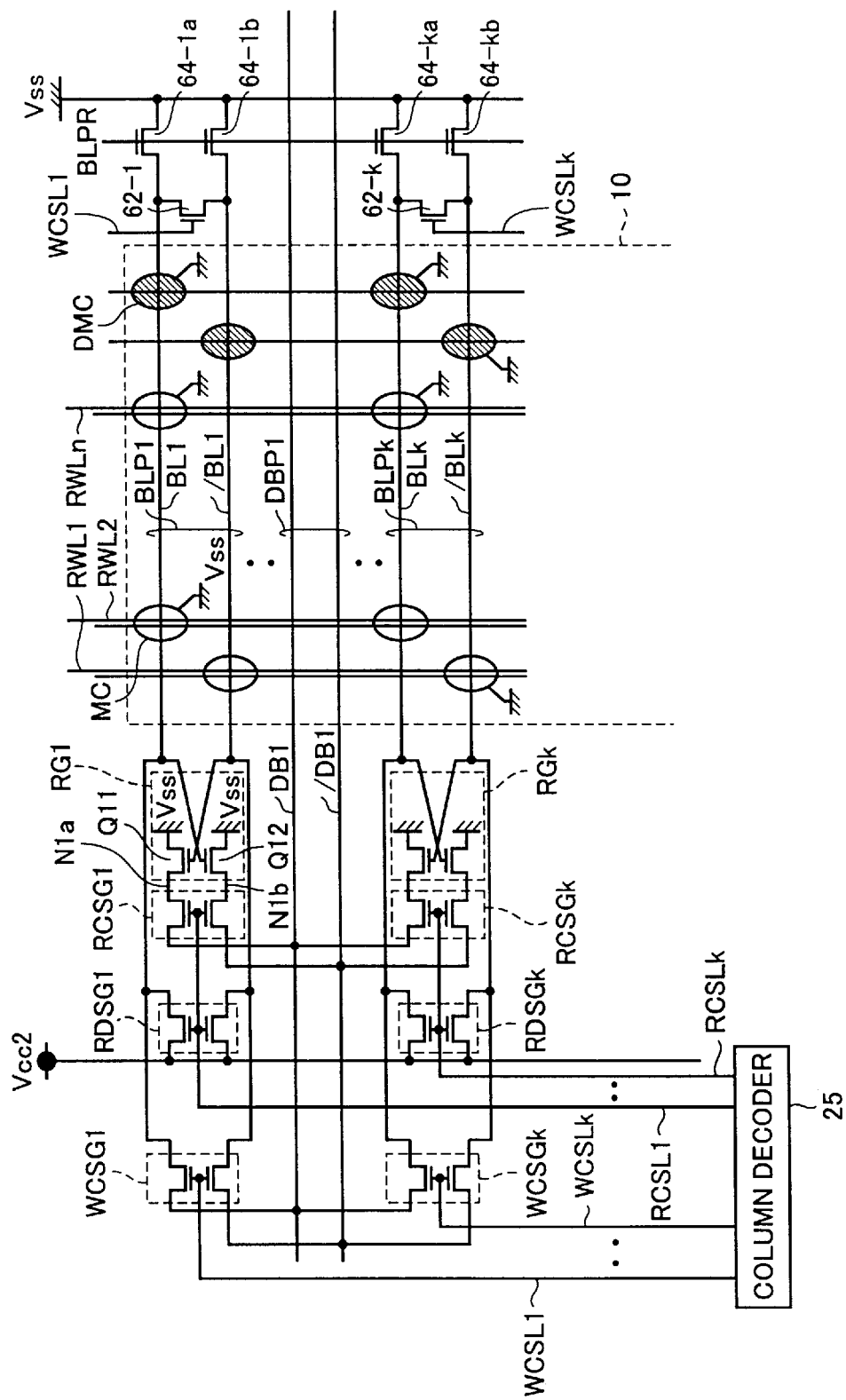
FIG. 11 is a circuit diagram for explaining the layout of a data bus pair illustrated in FIG. 10.

FIG. 11 is a circuit diagram for explaining the layout of data bus pair. Since data bus pairs DBP1 to DBPM are similarly disposed, in FIG. 11, the layout of data bus pair DBP is representatively shown.

Referring to FIG. 11, column decoder 25 selectively activates read column selection lines RCSL1 to RCSLk and write column selection lines WCSL1 to WCSLk for selecting a column from (k) memory cell columns corresponding to the same data bus pair.

In correspondence with the first to k-th memory cell columns, write column selection gate WCGS, read column selection gate RCSG, read gate RG, and read drive selection gate RDCG which are similar to those in the first embodiment are disposed. MTJ memory cells MC, dummy memory cells DMC, short-circuiting switch transistors 62, and precharge transistors 64 are also disposed in a manner similar to those in the memory array shown in FIG. 2.

In response to activation of corresponding read column selection line RCSL, read column selection gate RCSG electrically couples data buses DB1 and /DB1 and corresponding bit lines BL and /BL. Similarly, write column selection gate WCSG electrically couples corresponding bit lines BL and /BL and data buses DB1 and /DB1, respectively, in accordance with the voltage on corresponding write column selection line WCSL.

With such a configuration, one data bus pair DBP can be shared by (k) memory cell columns.

Data buses DB1 and /DB1 are disposed in the same direction as bit lines BL and /BL. On the other hand, read column selection line RCSL and write column selection line WCSL are disposed along the direction crossing bit lines BL and /BL (that is, row direction). With the configuration, the wide line pitch can be assured while avoiding concentration of lines disposed in the same direction as bit lines BL and /BL.

Referring again to FIG. 10, memory banks MB1 to MBN are selected according to a not-illustrated bank address. In a selected memory bank, read data DOUT and write data DIN of M' bits (M': natural number equal to or smaller than M) is supplied/received to/from the outside by a single data read command and a single data write command.

Therefore, in the data reading operation, data of M bits at the maximum can be read in parallel. As a result, an MRAM device particularly adapted to a system LSI or the like to be merged with a logic on the same chip can be constructed.

On the other hand, in the data write operation, a relatively large data write current has to be passed to bit lines BL and /BL. Consequently, when the number of bits of write data to be written in parallel (hereinbelow, also called "parallel write bit number") is large, proportionally, data consumption current also increases. Particularly, in the configuration of reading multi-bits in parallel, when the number of bits of read data to be read in parallel (hereinbelow, also called "parallel read bit number") is set similar to the number of bits to be written in parallel, a peak current value becomes excessive, and a burden on the power supply system increases. As a result, it is feared that an erroneous operation occurs due to an influence of power supply voltage bounce.

In the configuration according to the second embodiment, therefore, by a writing selection circuit 6 included in control circuit 5, the parallel write bit number is set to be smaller than the parallel read bit number.

For example, in the case of reading data of M' bits in parallel, the number of bits of data to be written in parallel at the same time in memory array 10 is set to N' bits (N': natural number smaller than M').

Figure 12A:
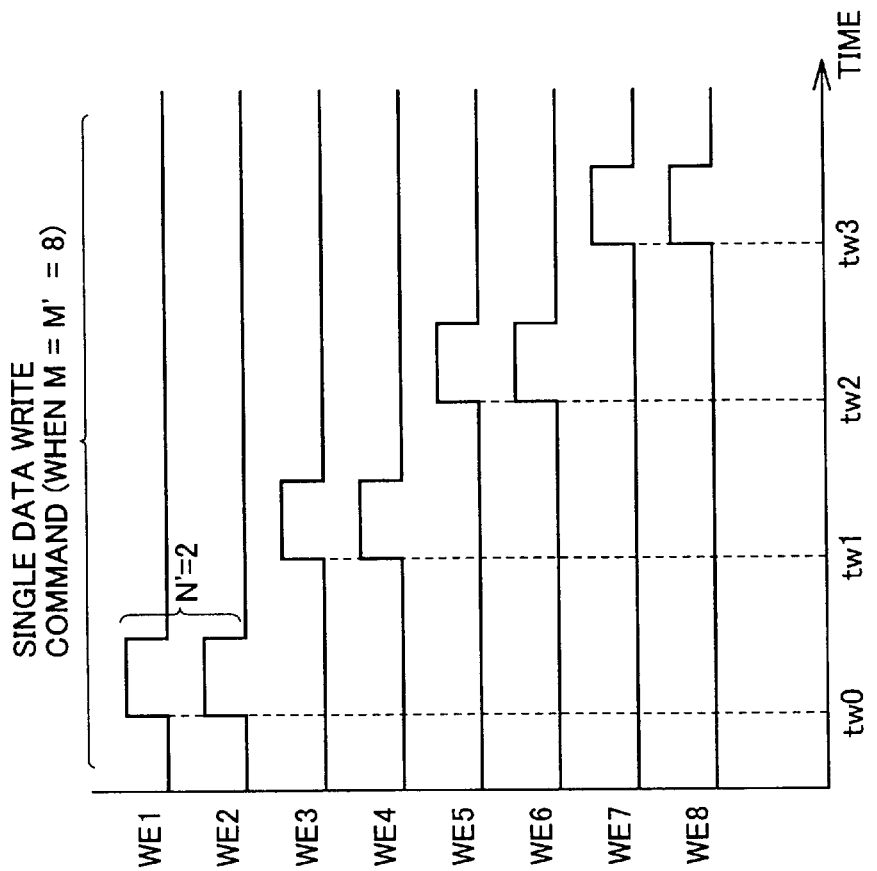
FIG. 12A is a timing chart for explaining control on operation of a data writing circuit by a control circuit.
Figure 12B:
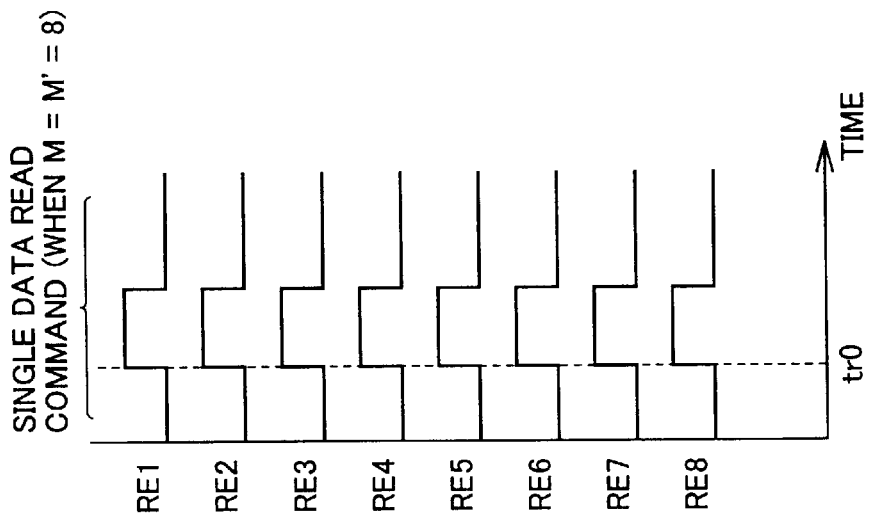
FIG. 12B is a timing chart for explaining control on operation of the data writing circuit by the control circuit.

Referring to FIGS. 12A and 12B, the operation control of the data reading circuit and the data writing circuit by control circuit 5 will now be described.

In FIGS. 12A and 12B, as an example, the case where the number M of data bus pairs DBP arranged and the number M' of bits of data transferred by a single data reading operation or data writing operation are equal to each other, that is, M=M'=8 will be described.

Referring to FIG. 12A, in the data read operation, a single data read command is started at time tr0 and read control signals RE1 to RE8 are simultaneously activated and data of eight bits (M' bits) are read in parallel. In such a case where M=M', each data reading circuit may be activated in response to a common read control signal RE.

Referring to FIG. 12B, in the data write operation, to suppress increase in the peak current, the parallel write bit number N' is set to be smaller than the parallel read bit number M'. For example, when a single data write command is started, write control signals WE1 to WEM are activated part by part at different times tw0, tw1, tw2, and tw3 by a write selecting circuit 6.

Each of data writing circuits WDV1 to WDVM is made active/inactive in response to the activation/inactivation of corresponding one of write control signals WE1 to WEM. In the activated data writing circuit, the supply of the operating current to inverters 154 to 156 shown in FIG. 5 is executed, and data writing operation using corresponding data bus pair DBP is executed. On the other hand, in the inactivated data writing circuit, the supply of the operating current to inverters 154 to 156 shown in FIG. 5 is stopped.

In the example shown in FIG. 12B, data is written every two bits (N' bits) in parallel. In other words, the write data of eight bits (M' bits) supplied by a single data write command is divided into four parts and data writing operation on the unit basis of two bits (N' bits) is executed.

As described above, in the configuration that data of plural bits can be read/written in memory array 10, parallel write bit number N' is set to be smaller than parallel read bit number M', or N' is set to be equal to "1" (N'=1) to access data bit by bit in serial, thereby enabling the peak current in the data write operation to be effectively reduced. As a result, the data rate in the data read operation in the MRAM device is improved, and the load on the power supply system is reduced by suppressing the peak current value in the data write operation, thereby enabling the operation reliability to be improved.

Particularly, by performing a single data writing command for writing data of M' bits by repeating parallel writing of N' bits (N': natural number smaller than M') M'/N' times, the length (bit number) of one data read command and the length (bit number) of one data write command can be adjusted to be the same.

Modification of Second Embodiment

Figure 13:
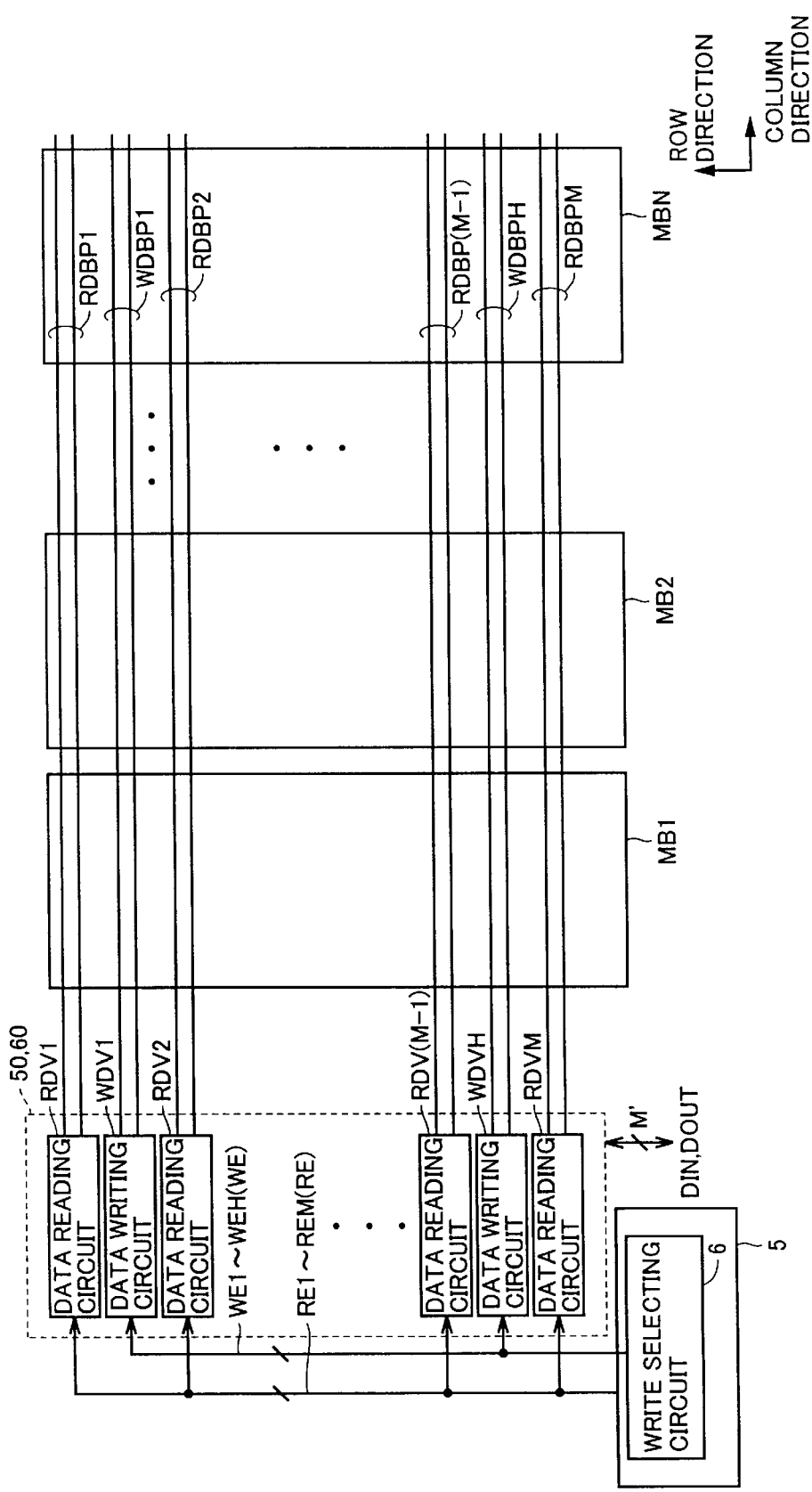
FIG. 13 is a schematic block diagram showing the configuration according to a modification of the second embodiment of the memory array and peripheral circuits of the memory array.

FIG. 13 is a schematic block diagram showing the configuration according to a modification of the second embodiment of memory array 10 and peripheral circuits of memory array 10.

In the configuration according to the modification of the second embodiment, data bus pair DBP is divided into a read data bus pair RDBP and a write data bus pair WDBP. Further, in whole memory array 10, the number of read data bus pairs RDBP disposed is different from that of write data bus pairs WDBP disposed.

FIG. 13 shows the configuration in which M read data bus pairs RDBP1 to RDBPM and H write data bus pairs WDBP1 to WDBPH (H: natural number smaller than M) are disposed in the whole memory array 10.

Each of read data bus pairs RDBP1 to RDBPM is disposed every (k) memory cell columns in a manner similar to the configuration according to the second embodiment. On the other hand, each of write data bus pairs WDBP1 to WDBPH is disposed every k' memory cell columns (k': natural number smaller than k).

In correspondence with read data bus pairs RDBP1 to RDBPM, data reading circuits RDV1 to RDVM are disposed in a manner similar to the second embodiment. Similarly, in correspondence with write data bus pairs WDBP1 to WDBPH, data write circuits WDV1 to WDVH are disposed in a manner similar to the configuration of the second embodiment. Since the configuration of the other portion is similar to that of the second embodiment, the detailed description will not be repeated.

With such a configuration, on the precondition that the parallel write bit number is smaller than the parallel read bit number, the number of data writing circuits WDV disposed can be reduced. Consequently, the flexibility of layout is improved and the chip area of the MRAM device can be reduced.

Further, by properly setting the ratio of the number of write data bus pairs WDBP and the number of read data bus pairs RDBP, it becomes unnecessary to perform a control of selecting activation in the data writing circuit and the data reading circuit. For example, with a configuration such that by setting the number of write data bus pairs WDBP disposed to be equal to the parallel write bit number (H=N') and further setting the number of read data bus pairs RDBP disposed to be equal to the parallel read bit number (M=M'), data reading circuits are activated in parallel on the basis of common read control signal RE in the data reading operation and, on the other hand, data writing circuits are activated in parallel in response to common write control signal WE in the data write operation, an effect similar to the second embodiment can be obtained. Consequently, the operating control of each of the data writing circuit and data reading circuit is facilitated.

In a manner similar to the second embodiment, by executing a single data writing command for writing data of M' bits by repeating parallel writing of N' bits (N': natural number smaller than M') M'/N' times, the length (the number of bits) of one data read command and the length (the number of bits) of one data write command can be adjusted to be the same.

Particularly, as described above, on the condition that H=N' and M=M', M/H as a ratio of the number of write data bus pairs WDBP and the number of read data bus pairs RDBP is determined to be an integer, and the parallel data writing operation of H bits is repeatedly executed M/H times by using different memory banks. With the configuration, without performing the activation selecting control in each of the data writing circuits and each of the data reading circuits, the length (the number of bits) of one data read command and the length (the number of bits) of one data write command can be adjusted to the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
    a plurality of memory cells each for holding storage data, each of said memory cells including
        a magnetic storing portion having an electric resistance varying according to a level of said storage data, and
        an access gate being selectively turned on in a data read operation;
    a decoding unit for designating a selected memory cell corresponding to a target from/to which data is read/written from said plurality of memory cells in accordance with an address signal;
    a bit line disposed every predetermined section of said plurality of memory cells and coupled to a first voltage via the magnetic storing portion of said selected memory cell in response to turn-on of the access gate of said selected memory cell in said data read operation;
    a bit line driving unit for electrically coupling said bit line to a second voltage which is determined so that a voltage applied across said selected memory cell becomes lower than a predetermined voltage in said data reading operation;
    a read data bus shared by said plurality of memory cells, for transmitting read data from said selected memory cell;
    a read gate circuit for driving a voltage on said read data bus to a fixed voltage by a driving force according to the voltage on the bit line coupled to said selected memory cell; and a data reading circuit for generating said read data by sensing and amplifying the voltage on said read data bus.

2. The thin film magnetic memory device according to claim 1, wherein said magnetic storing portion has a fixed magnetic layer having a fixed magnetization direction, a free magnetic layer magnetized in a direction according to a level of said storage data by a magnetic field generated by a data write current, and a tunneling film for passing a data read current, formed between said fixed magnetic layer and said free magnetic layer, said electric resistance varies according to a relative relation between the magnetization direction of said fixed magnetic layer and the magnetization direction of said free magnetic layer, and said predetermined voltage is determined in consideration of reliability of said tunneling film.

3. The thin film magnetic memory device according to claim 1, wherein said plurality of memory cells are disposed in a matrix, said bit line is provided for each column of said plurality of memory cells, said bit line driving unit is provided for said each column and includes a column selection gate electrically coupled between a corresponding bit line and said second voltage, and said column selection gate is turned on when a corresponding column includes a selected memory cell in accordance with an instruction of said decoding circuit.

4. The thin film magnetic memory device according to claim 1, wherein said plurality of memory cells are disposed in a matrix, said bit line is provided for each column of said plurality of memory cells, said thin film magnetic memory device further includes:

a write data bus for transmitting a data write current;

a data writing circuit for supplying said data write current in the direction according to a level of a write data to said write data bus in a data write operation;

a column selection gate provided for said each column and, when a corresponding column includes a selected memory cell, for electrically coupling a corresponding bit line to said write data line, and a pull-up circuit for coupling said write data bus to said second voltage in said data read operation, and said pull-up circuit disconnects said write data bus from said second voltage in said data write operation.

5. The thin film magnetic memory device according to claim 1, wherein said data reading circuit operates on a third voltage supplied, and said third voltage is higher than said second voltage.

6. The thin film magnetic memory device according to claim 1, wherein said first voltage is a ground voltage and said bit line is precharged to said ground voltage before said data read operation.

7. A thin film magnetic memory device comprising:

a plurality of memory cells each for holding storage data, each of said memory cells including a magnetic storing portion being magnetized in a direction according to a level of said storage data by a magnetic field generated by a data write current and having an electric resistance varying according to the direction of said magnetization, and an access gate for being selectively turned on in a data read operation;

a decoding unit for designating a selected memory cell corresponding to a target from/to which data is read/written from said plurality of memory cells in accordance with an address signal;

a bit line disposed every predetermined section of said plurality of memory cells in order to transmit an electric signal according to the level of said storage data and, in said data read operation, coupled to a first voltage via the magnetic storing portion of said selected memory cell in response to turn-on of the access gate of said selected memory cell;

a bit line driving unit for electrically coupling said bit line to a second voltage in said data read operation;

a read data bus shared by said plurality of memory cells, for transmitting read data from said selected memory cell;

a read gate circuit for driving a voltage on said read data bus to a fixed voltage by a driving force according to the voltage on the bit line coupled to said selected memory cell;

a data reading circuit for generating said read data by sensing and amplifying the voltage on said read data bus; and a data writing circuit which operates a third voltage supplied which is higher than said second voltage, in a data write operation, for supplying said data write current to the bit line corresponding to said selected memory cell.

8. The thin film magnetic memory device according to claim 7, wherein said magnetic storing portion has a fixed magnetic layer having a fixed magnetization direction, a free magnetic layer magnetized in a direction according to a magnetic field generated by said data write current, and a tunneling film for passing a data read current, formed between said fixed magnetic layer and said free magnetic layer, said electric resistance varies according to a relative relation between the magnetization direction of said fixed magnetic layer and the magnetization direction of said free magnetic layer, and said second voltage is determined so that a voltage applied across said selected memory cell becomes lower than a predetermined voltage said predetermined voltage is determined in consideration of reliability of said tunneling film.

9. The thin film magnetic memory device according to claim 7, wherein as said third voltage, an external power supply voltage supplied from the outside of said thin film magnetic memory device is used.

10. The thin film magnetic memory device according to claim 7, wherein said data reading circuit operates on a fourth voltage supplied and, said fourth voltage is lower than said third voltage and higher than said second voltage.

11. A thin film magnetic memory device comprising:

a plurality of memory cells disposed in a matrix, each of said memory cells including a magnetic storing portion being magnetized in a direction according to a level of storage data by a magnetic field generated by a data write current and having an electric resistance varying according to the direction of said magnetization, and an access gate which is selectively turned on in a data read operation to pass a data read current to said magnetic storing portion;

a plurality of bit lines each disposed corresponding a memory cell column, each for transmitting an electric signal according to the level of said storage data;

a plurality of read data lines each for transmitting read data from a selected memory cell;

a plurality of write data lines each for transmitting write data to a selected memory cell; and a control circuit for instructing parallel data reading of M (M: integer at least 2) bits by using at least a part of said plurality of read data lines in said data read operation, and for instructing parallel data writing of N (N: natural number smaller than M) bits by using a part of said plurality of write data lines in a data write operation.

12. The thin film magnetic memory device according to claim 11, wherein said plurality of read data lines and said plurality of write data lines are disposed in a direction along said plurality of bit lines.

13. The thin film magnetic memory device according to claim 11, wherein equal numbers of said plurality of read data lines and said plurality of write data lines are disposed, each of said read data lines and each of said write data lines are formed as the same line by using a data bus disposed every predetermined section of said plurality of memory cells, said thin film magnetic memory device further comprises a data reading circuit provided for each said data bus and selectively activated in a data read operation to execute data reading from said selected memory cell in accordance with the voltage of said data bus and a data writing circuit provided for each said data bus and selectively activated in a data write operation to supply said data write current to a corresponding data bus, and said control circuit activates M data reading circuits in said data read operation and selectively activates N data writing circuits in said data write operation.

14. The thin film magnetic memory device according to claim 13, wherein M pieces of said data buses are disposed in total, and said control circuit activates each of said data reading circuits in said data read operation and selectively activates N data writing circuits out of M data writing circuits in said data write operation.

15. The thin film magnetic memory device according to claim 11, wherein each of said plurality of read data lines is disposed every K (K: integer at least 2) pieces of said memory cell columns, each of said plurality of write data lines is disposed every L (L: integer larger than K) pieces of said memory cell columns, and said control circuit activates M data reading circuits in said data read operation and activates N data writing circuits in said data write operation.

16. The thin film magnetic memory device according to claim 15, wherein N pieces of said plurality of write data lines are disposed in total, M pieces of said plurality of read data lines are disposed in total, and said control circuit activates each of said data reading circuits in said data read operation and activates each of said data writing circuits in said data write operation.

17. The thin film magnetic memory device according to claim 11, wherein said M bits is an integral multiple of said N bits, and said control circuit repeatedly instructs said parallel data writing of N bits by M/N times in response to a single data write command.

18. A thin film magnetic memory device comprising:

a plurality of memory cells each for holding storage data, each of said memory cells including a magnetic storing portion having an electric resistance varying according to a level of said storage data;

a decoding unit for designating a selected memory cell corresponding to a target from/to which data is read/written from said plurality of memory cells in accordance with an address signal;

a bit line disposed every predetermined section of said plurality of memory cells, and electrically coupled to a first voltage via the magnetic storing portion of said selected memory cell in a data read operation;

a read data bus shared by said plurality of memory cells, for transmitting read data from said selected memory cell;

a read gate circuit for driving a voltage on said read data bus to a fixed voltage by a driving force according to the voltage on the bit line coupled to said selected memory cell; and a data reading circuit for generating said read data by sensing and amplifying the voltage on said read data bus.

19. The thin film magnetic memory device according to claim 18, wherein said magnetic storing portion has a fixed magnetic layer having a fixed magnetization direction, a free magnetic layer magnetized in a direction according to a level of said storage data by a magnetic field generated by a data write current, and a tunneling film for passing a data read current, formed between said fixed magnetic layer and said free magnetic layer, said electric resistance varies according to a relative relation between the magnetization direction of said fixed magnetic layer and the magnetization direction of said free magnetic layer, said bit line is driven to a second voltage in said data read operation, and a difference between said first and second voltages is determined in consideration of reliability of said tunneling film.

20. The thin film magnetic memory device according to claim 18, wherein said plurality of memory cells are disposed in a matrix, said bit line is provided for each column of said plurality of memory cells, said thin film magnetic memory device further comprises
a bit line driving unit provided for said each column
and driving a corresponding bit line by a second
voltage, said bit line driving unit includes a column
selection gate electrically coupled between a corresponding bit line and said second voltage, and said column selection gate is turned on when a corresponding column includes a selected memory cell in
accordance with an instruction of said decoding circuit.

21. The thin film magnetic memory device according to claim 18, wherein said plurality of memory cells are disposed in a matrix, 'said bit line is provided for each column of said plurality of memory cells, said thin film magnetic memory device further includes:

a write data bus for transmitting a data write current;

a data writing circuit for supplying said data write current in the direction according to a level of a write data to said write data bus in a data write operation;

a column selection gate provided for said each column and, when a corresponding column includes a selected memory cell, for electrically coupling a corresponding bit line to said write data line, and a pull-up circuit for coupling said write data bus to a second voltage in said data read operation, and said pull-up circuit disconnects said write data bus from said second voltage in said data write operation.

22. The thin film magnetic memory device accordingto claim 18, wherein said data reading circuit operates on a third voltage supplied, and said third voltage is higher than said second voltage.

23. The thin film magnetic memory device according to claim 18, wherein said first voltage is a ground voltage and said bit line is precharged to said ground voltage before said data read operation.

24. A thin film magnetic memory device comprising:

a plurality of memory cells each for holding storage data, each of said memory cells including a magnetic storing portion being magnetized in a direction according to a level of said storage data by a magnetic field generated by a data write current and having an elelctric resistance varying according to the direction of said magnetization;

a decoding unit for designating a selected memory cell corresponding to a target from/to which data is read/written from said plurality of memory cells in accordance with an address signal;

a bit line disposed every predetermined section of said plurality of memory cells in order to transmit an electric signal according to the level of said storage data and, in a data read operation, coupled to a first voltage via the magnetic storing portion of said selected memory cell;

a bit line driving unit for electrically coupling said bit line to a second voltage in said data read operation;

a data reading circuit for generating said read data based on a voltage on said bit line; and a data writing circuit which operates on a third voltage supplied which is higher than said second voltage, in a data write operation, for supplying said data write current to the bit line corresponding to said selected memory cell.

25. The thin film magnetic memory device according to claim 24, wherein an external power supply voltage supplied to said thin film magnetic memory device is used as said third voltage.

26. The thin film magnetic memory device according to claim 24, wherein said data reading circuit operates on a fourth voltage supplied, and said third voltage is higher than said fourth voltage.

27. The thin film magnetic memory device according to claim 26, wherein said fourth voltage is higher than said second voltage.

28. A thin film magnetic memory device comprising:

a plurality of memory cells each for holding storage data, each of said memory cells including a data storing portion having an electric resistance varying according to a level of said storage data which is written by a data write current;

a decoding unit for designating a selected memory cell corresponding to a target from/to which data is read/written from said plurality of memory cells in accordance with an address signal;

a bit line disposed every predetermined section of said plurality of memory cells in order to transmit an electric signal according to the level of said storage data and, in a data read operation, coupled to a first voltage via the data storing portion of said selected memory cell;

a bit line driving unit for electrically coupling said bit line to a second voltage in said data read operation;

a data reading circuit for generating said read data based on a voltage on said bit line; and a data writing circuit generating said data write current for said selected memory cell in a data write operation, wherein said data writing circuit operates on a third voltage supplied which is higher than said second voltage.

29. The thin film magnetic memory device according to claim 28, wherein an external power supply voltage supplied to said thin film magnetic memory device is used as said third voltage.

30. The thin film magnetic memory device according to claim 28, wherein said data reading circuit operates on a fourth voltage supplied, and said third voltage is higher than said fourth voltage.

31. The thin film magnetic memory device according to claim 30, wherein said fourth voltage is higher than said second voltage.

* * * * *